(12) United States Patent
Kurosaka et al.

(10) Patent No.: US 11,374,383 B2
(45) Date of Patent: Jun. 28, 2022

(54) SEMICONDUCTOR LIGHT EMITTING ELEMENT

(71) Applicant: HAMAMATSU PHOTONICS K.K., Hamamatsu (JP)

(72) Inventors: Yoshitaka Kurosaka, Hamamatsu (JP); Kazuyoshi Hirose, Hamamatsu (JP); Takahiro Sugiyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 247 days.

(21) Appl. No.: 16/756,513

(22) PCT Filed: Oct. 2, 2018

(86) PCT No.: PCT/JP2018/036926
§ 371 (c)(1),
(2) Date: Apr. 16, 2020

(87) PCT Pub. No.: WO2019/077997
PCT Pub. Date: Apr. 25, 2019

(65) Prior Publication Data
US 2020/0287350 A1 Sep. 10, 2020

(30) Foreign Application Priority Data
Oct. 20, 2017 (JP) .............................. JP2017-203852

(51) Int. Cl.
*H01S 3/00* (2006.01)
*H01S 5/18* (2021.01)
*H01S 5/11* (2021.01)

(52) U.S. Cl.
CPC .............. *H01S 5/18* (2013.01); *H01S 3/0085* (2013.01); *H01S 5/11* (2021.01); *H01S 2301/18* (2013.01); *H01S 2301/20* (2013.01)

(58) Field of Classification Search
CPC . H01S 5/18; H01S 3/0085; H01S 5/11; H01S 2301/18; H01S 2301/20
See application file for complete search history.

(56) References Cited

U.S. PATENT DOCUMENTS

2016/0020580 A1* 1/2016 Takiguchi ................ H01S 5/11
372/44.011
2017/0160473 A1 6/2017 Mazur et al.

FOREIGN PATENT DOCUMENTS

| JP | 2008-243962 A | 10/2008 |
| JP | 2009-010182 A | 1/2009 |

(Continued)

OTHER PUBLICATIONS

Machine Translation of WO2016148075A1 (Year: 2016).*
(Continued)

*Primary Examiner* — Yuanda Zhang
(74) *Attorney, Agent, or Firm* — Faegre Drinker Biddle & Reath LLP

(57) ABSTRACT

A semiconductor light emitting element that can form a useful beam pattern is provided. A semiconductor laser element LD includes an active layer 4, a pair of cladding layers 2 and 7 between which the active layer 4 is interposed, and a phase modulation layer 6 optically coupled to the active layer 4. The phase modulation layer 6 includes a base layer 6A and different refractive index regions 6B that are different in refractive index from the base layer 6A. The different refractive index regions 6B desirably arranged in the phase modulation layer 6 enable emission of laser light including a dark line with no zero-order light.

6 Claims, 19 Drawing Sheets

(56) References Cited

FOREIGN PATENT DOCUMENTS

| | | |
|---|---|---|
| JP | 2010-056446 A | 3/2010 |
| JP | 2013-211542 A | 10/2013 |
| JP | 2014-197665 A | 10/2014 |
| JP | 2014-236127 A | 12/2014 |
| JP | 2015-523726 A | 8/2015 |
| JP | 6080941 B2 | 2/2017 |
| WO | WO-2013/191745 A1 | 12/2013 |
| WO | WO 2014/136607 A1 | 9/2014 |
| WO | WO 2014/136955 A1 | 9/2014 |
| WO | WO-2014/136962 A1 | 9/2014 |
| WO | WO-2015/163958 A2 | 10/2015 |
| WO | WO-2016/148075 A1 | 9/2016 |
| WO | WO 2017/150387 A1 | 9/2017 |

OTHER PUBLICATIONS

International Preliminary Report on Patentability dated Apr. 30, 2020 for PCT/JP2018/036926.
Yoshitaka Kurosaka, et al., "Phase-modulating lasers toward on-chip integration", Scientific Reports, Jul. 26, 2016, vol. 6, p. 30138.
Tsuyoshi Okino, et al., "Position-modulated photonic-crystal lasers and control of beam direction and polarization", 2015 Conference on Lasers and Electro-Optics (CLEO), May 10, 2015, p. SW1F.1.

* cited by examiner

Fig.3

| | MATERIAL | CONDUCTIVITY TYPE | THICKNESS (nm) |
|---|---|---|---|
| CONTACT LAYER 8 | GaAs | P | 50~500 (200) |
| UPPER CLADDING LAYER 7 | AlGaAs | P | $1\times10^3 \sim 3\times10^3$ ($2\times10^3$) |
| PHASE MODULATION LAYER 6 (DIFFRACTION GRATING LAYER) | BASE LAYER 6A: GaAs DIFFERENT REFRACTIVE INDEX REGION 6B: AlGaAs | – | 50~200 (100) |
| UPPER LIGHT GUIDE LAYER 5 | UPPER LAYER: GaAs | – | 10~200 (50) |
| | LOWER LAYER: AlGaAs | P(I) | 10~100 (50) |
| ACTIVE LAYER 4 | MQW: AlGaAs/InGaAs | – | 10~100 (30) |
| LOWER LIGHT GUIDE LAYER 3 | AlGaAs | – | 0~300 (150) |
| LOWER CLADDING LAYER 2 | AlGaAs | N | $1\times10^3 \sim 3\times10^3$ ($2\times10^3$) |
| SEMICONDUCTOR SUBSTRATE 1 | GaAs | N | $80\times10^3 \sim 350\times10^3$ ($150\times10^3$) |

Fig.5
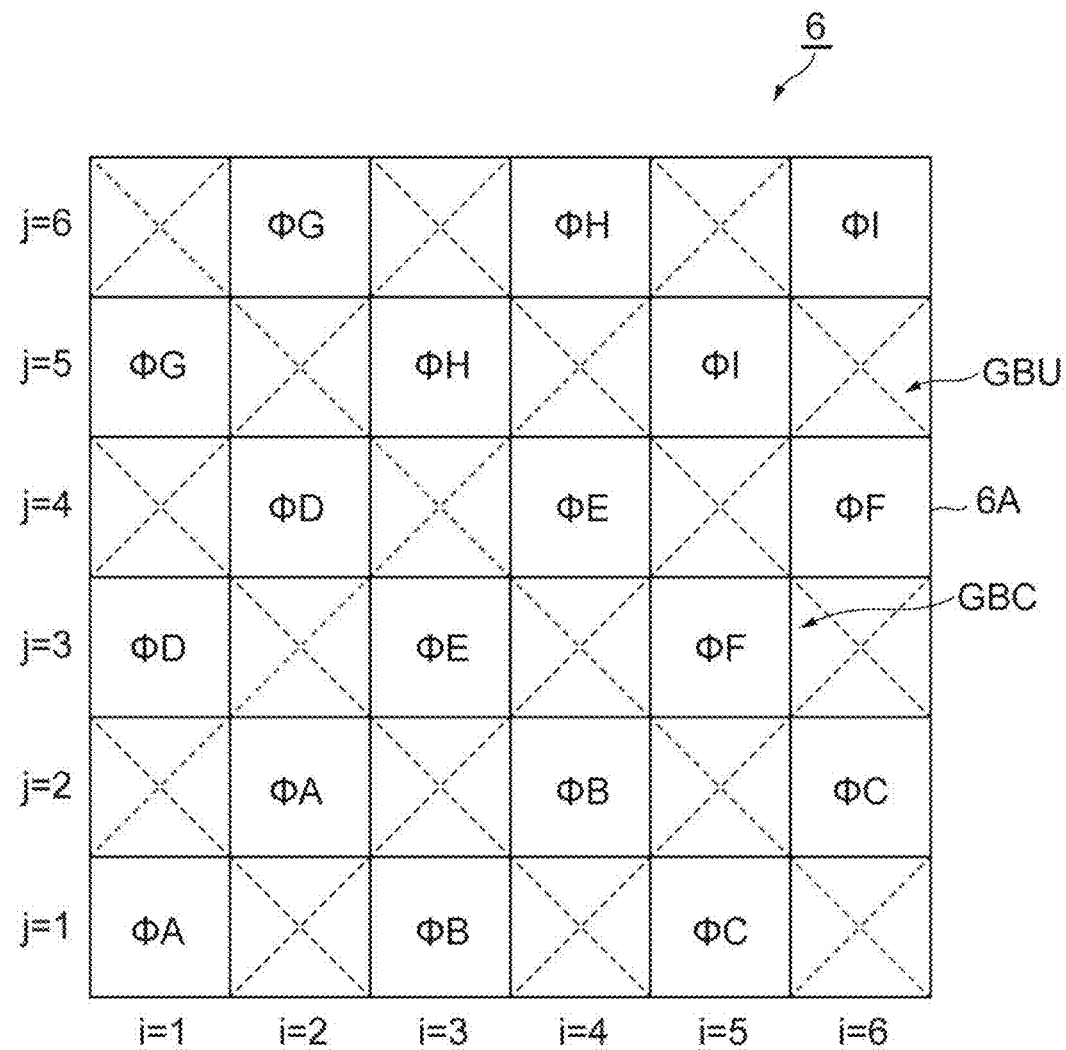
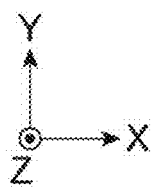

Fig.9
(A) Γ POINT
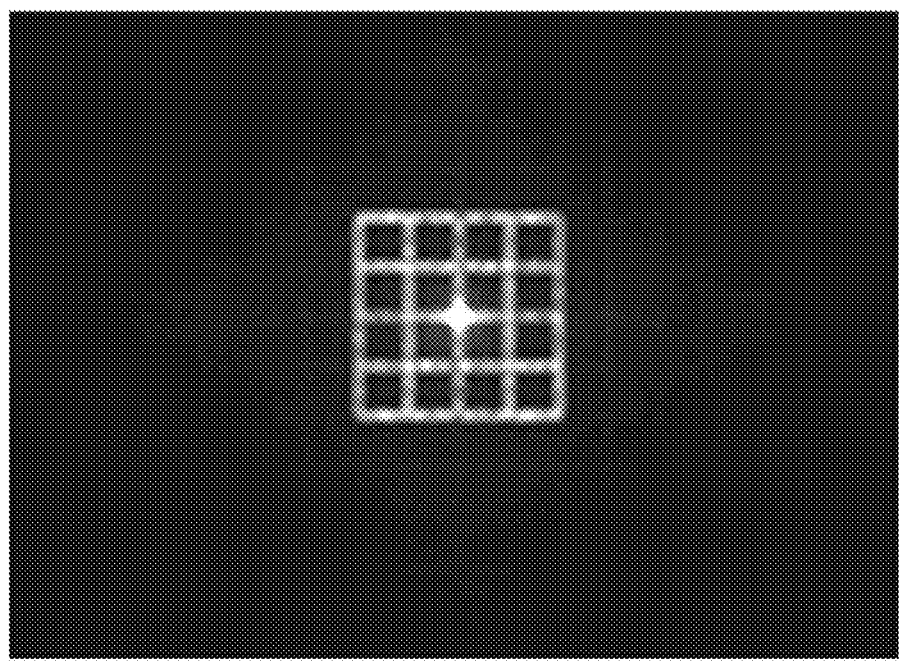
(B) M POINT
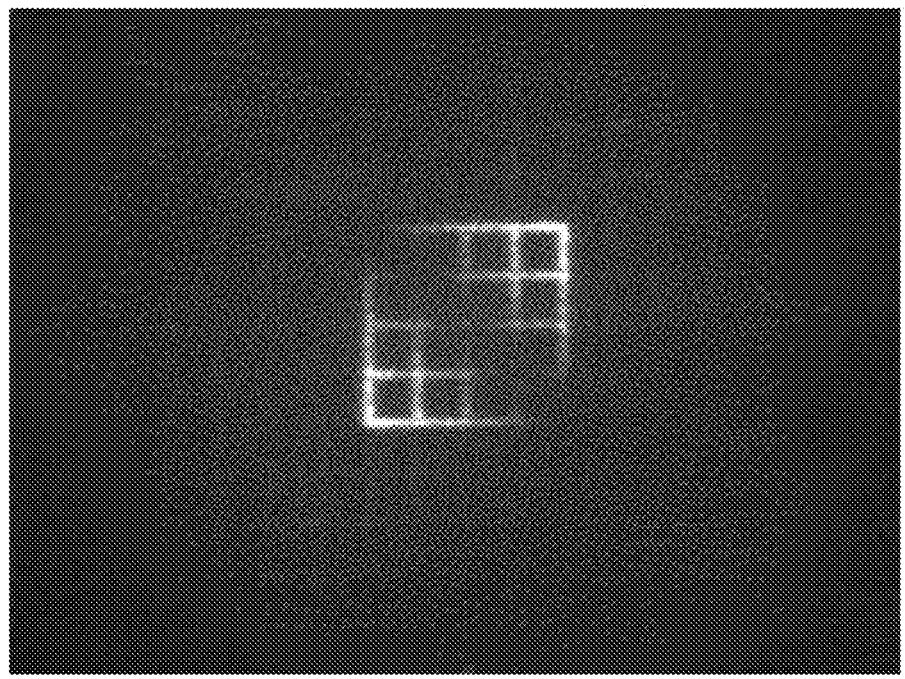

| ΦD | ΦE |
|----|----|
| ΦA | ΦB |

(B)

|    | ΦD |    | ΦE |
|----|----|----|----|
| ΦD |    | ΦE |    |
|    | ΦA |    | ΦB |
| ΦA |    | ΦB |    |

(A)           (B)

| | |
|---|---|
| EQUATION (A1) | $x = r\sin\theta_{tilt}\cos\theta_{rot}$ |
| EQUATION (A2) | $y = r\sin\theta_{tilt}\sin\theta_{rot}$ |
| EQUATION (A3) | $z = r\cos\theta_{tilt}$ |
| EQUATION (A4) | $k_x = \dfrac{a}{\lambda}\sin\theta_{tilt}\cos\theta_{rot}$ |
| EQUATION (A5) | $k_y = \dfrac{a}{\lambda}\sin\theta_{tilt}\sin\theta_{rot}$ |
| EQUATION (A6) | $F(x,y) = \sum\limits_{k_x=1}^{M2}\sum\limits_{k_y=1}^{N2} FR(k_x,k_y)\exp[j2\pi(k_x x + k_y y)]$ |
| EQUATION (A7) | $F(x,y) = A(x,y) \times \exp[jP(x,y)]$ |
| EQUATION (A8) | $\phi(x,y) = C \times P(x,y) + B$ |

Fig.16

SEMICONDUCTOR LIGHT EMITTING ELEMENT

TECHNICAL FIELD

The present invention relates to a semiconductor light emitting element.

BACKGROUND ART

The inventors of the present application have proposed a semiconductor light emitting element disclosed in Patent Literature 1. The semiconductor light emitting element disclosed in Patent Literature 1 includes an active layer, a pair of cladding layers between which the active layer is interposed, and a phase modulation layer optically coupled to the active layer, in which the phase modulation layer includes a base layer and different refractive index regions that are different in refractive index from the base layer. In a case where a square lattice is set on the phase modulation layer, the different refractive index regions (main holes) are arranged exactly coinciding with the lattice points of the square lattice. An auxiliary different refractive index region (sub hole) is provided around the different refractive index region, so that light having a predetermined beam pattern can be emitted.

Furthermore, the inventors of the present application have proposed a semiconductor light emitting element disclosed in Patent Literature 2. In the semiconductor light emitting element, because the auxiliary different refractive index region (sub hole) is shifted in arrangement by a predetermined distance from the corresponding position of the lattice point, a desired beam pattern can be acquired easier than ever before. In addition, Patent Literature 3, Non Patent Literature 1 and Non Patent Literature 2 have been known as related technologies.

CITATION LIST

Patent Literature

Patent Literature 1: International Publication No. 2014/136962
Patent Literature 2: International Publication No. 2016/148075
Patent Literature 3: Japanese Patent No. 6080941

Non Patent Literature

Non Patent Literature 1: Yoshitaka Kurosaka, Kazuyoshi Hirose, Takahiro Sugiyama, Yu Takiguchi, Yoshiro Nomoto, "Phase-modulating lasers toward on-chip integration", [online], Published: 26 Jul. 2016, Nature, [Searched: 6 Jul. 2017] Internet <URL:http://www.nature.com/articles/srep30138.pdf>

Non Patent Literature 2: Y. Kurosaka et al., "Controlling vertical optical confinement in two-dimensional surface-emitting photonic-crystal lasers by shape of air holes," Opt. Express 16, 18485-18494 (2008).

SUMMARY OF INVENTION

Technical Problem

As described above, the inventors of the present application have developed semiconductor light emitting elements, which generate light. However, in comparison with the semiconductor light emitting elements, a technique of forming a completely new beam pattern has been expected.

The present invention has been made in consideration of such an expectation, and an object of the present invention is to provide a semiconductor light emitting element capable of forming an unprecedented useful beam pattern.

Solution to Problem

The inventors of the present application have developed a semiconductor light emitting element capable of forming a completely new beam pattern. That is, it is a technology seed of forming a dark line. Because an irradiated object varies in behavior between a bright portion and a dark portion, the present invention is considered to be applied to, for example, various types of measurement technology.

A first semiconductor light emitting element includes: an active layer; a pair of cladding layers between which the active layer is interposed; and a phase modulation layer optically coupled to the active layer, wherein the phase modulation layer includes: a base layer; and different refractive index regions each having a different index from that of the base layer, an XYZ orthogonal coordinate system is set in which a thickness direction of the phase modulation layer is defined as a Z-axis direction, a virtual square lattice is set in an XY plane, a lattice constant $a$ of the virtual square lattice satisfies $\lambda=\sqrt{2}\times a\times n$, where $\lambda$ is an emission wavelength, n is an effective refractive index of the phase modulation layer with respect to output light, and a pair of adjacent different refractive index regions in the phase modulation layer with a pitch of $a$ between the different refractive index regions is arranged so as to coincide with each other in a case where shifting is made by the pitch of $a$ only in one direction and so as not to coincide with each other in other directions. According to the semiconductor light emitting element, zero-order light that should be conventionally present at the center of output light disappears. With brightness on both sides thereof, light including a dark line with no zero-order light is output.

As a more preferable structure than that of the semiconductor light emitting element described above, a second semiconductor light emitting element includes: an active layer; a pair of cladding layers between which the active layer is interposed; and a phase modulation layer optically coupled to the active layer, in which the phase modulation layer includes: a base layer; and different refractive index regions that are different in refractive index from the base layer, an XYZ orthogonal coordinate system is set in which a thickness direction of the phase modulation layer is defined as a Z-axis direction, a first virtual square lattice is set in an XY plane, a pitch in an X-axis direction of the first virtual square lattice is $a/\sqrt{2}$, a pitch in a Y-axis direction of the first virtual square lattice is $a/\sqrt{2}$, XY coordinates $(x_i, y_j)$ of a barycentric position of an opening of the first virtual square lattice satisfy $(x_i, y_j)=((i-0.5)\,a/\sqrt{2}, (j-0.5)\,a/\sqrt{2})$, where i and j each is an integer, a vector connecting XY coordinates $(x_{Bi}, y_{Bj})$ of a barycentric position of any of the different refractive index regions and the XY coordinates $(x_i, y_j)$ closest to the different refractive index region, directed from the XY coordinates $(x_i, y_j)$ to the XY coordinates $(x_{Bi}, y_{Bj})$ of the barycentric position of the different refractive index region, is defined as $(\Delta x_i, \Delta y_j)$, and in a case where the coordinates $(x_{Bi}, y_{Bj})$ of the barycentric position of the different refractive index region are present with i that is an odd number, the coordinates $(x_{Bi}, y_{Bj})$ of the barycentric position of any of the different refractive index regions are present only in a case where i is an odd number and j is an odd number and in a case where i is an even number and j is an even number, the vector $(\Delta_i, \Delta y_j)$ for the coordinates $(x_{Bi}, y_{Bj})=(x_i+\Delta x_i, y_j+\Delta y_j)$ with i and j that are odd numbers ($3\le i$, $3\le j$) is equal to a vector $(\Delta x_{i+1}, \Delta y_{j+1})$ but is different from a vector $(\Delta x_{i-1}, \Delta y_{j+1})$, a vector $(\Delta x_{i-1}, \Delta y_{j-1})$, and a vector $(\Delta x_{i+1}, \Delta y_{j-1})$, and the vector $(\Delta x_i, \Delta y_j)$ for the coordinates $(x_{Bi}, y_{Bj})=(x_i+\Delta_i, y_j+\Delta y_j)$ with i and j that are even numbers ($2\le i$, $2\le j$) is equal to the vector $(\Delta x_{i-i}, \Delta y_{j-1})$ but is different from the vector $(\Delta x_{i-1}, \Delta y_{j+1})$, the vector $(\Delta x_{i+1}, \Delta y_{j+1})$, and the vector $(\Delta x_{i+1}, \Delta y_{j-1})$.

In this case, considering a second virtual square lattice having each side having a length of a, with the coordinates $(x_{Bi}, y_{Bj})$ of the barycentric position of the different refractive index region (present only in a case where i is an odd number and j is an odd number and in a case where i is an even number and j is an even number) as the center with the first virtual square lattice rotated by 45° in the XY plane, one unit region including the different refractive index region in the first virtual square lattice, is located at the center of the second virtual square lattice. In this case, characteristically, a single unit lattice of the second virtual square lattice (and the single unit lattice of the first virtual square lattice included therein) is identical in shape to the unit lattice in one direction from the adjacent four directions in which grid lines extend, but is not identical in shape to the unit lattices in the other three directions.

Note that, the case where the coordinates $(x_{Bi}, y_{Bj})$ of the barycentric position of any of the different refractive index regions are present only in a case where i is an odd number and j is an odd number and, in a case, where i is an even number and j is an even number, has been given as above. However, the same is true in a case where i is an odd number and j is an even number and, in a case, where i is an even number and j is an odd number.

That is a third semiconductor light emitting element includes: an active layer; a pair of cladding layers between which the active layer is interposed; and a phase modulation layer optically coupled to the active layer, in which the phase modulation layer includes: a base layer; and different refractive index regions that are different in refractive index from the base layer, an XYZ orthogonal coordinate system is set in which a thickness direction of the phase modulation layer is defined as a Z-axis direction, a first virtual square lattice is set in an XY plane, a pitch in an X-axis direction of the first virtual square lattice is $\alpha/\sqrt{2}$, a pitch in a Y-axis direction of the first virtual square lattice is $\alpha/\sqrt{2}$, XY coordinates $(x_i, y_j)$ of a barycentric position of an opening of the first virtual square lattice satisfy $(x_i, y_j)=((i-0.5)\,\alpha/\sqrt{2}, (j-0.5)\,\alpha/\sqrt{2})$, where i and j each is an integer, a vector connecting XY coordinates $(x_{Bi}, y_{Bj})$ of a barycentric position of any of the different refractive index regions and the XY coordinates $(x_i, y_j)$ closest to the different refractive index region, directed from the XY coordinates $(x_i, y_j)$ to the XY coordinates $(x_{Bi}, y_{Bj})$ of the barycentric position of the different refractive index region, is defined as $(\Delta x_i, \Delta y_j)$, and in a case where the coordinates $(x_{Bi}, y_{Bj})$ of the barycentric position of the different refractive index region is present with i+j that is an odd number, the coordinates $(x_{Bi}, y_{Bj})$ of the barycentric position of any of the different refractive index regions are present only in a case where i is an odd number and j is an even number and in a case where i is an even number and j is an odd number, the vector $(\Delta x_i, \Delta y_j)$ for the coordinates $(x_{Bi}, y_{Bj})=(x_i+\Delta x_i, y_j+\Delta y_j)$ with i that is an even number ($2\le i$) and j that is an odd number ($1\le j$) is equal to a vector $(\Delta x_{i-1}, \Delta y_{j+i})$ but is different from a vector$(\Delta x_{i+1}, \Delta y_{j+1})$, a vector $(\Delta x_{i-i}, \Delta y_{j-1})$, and a vector $(\Delta x_{i+1}, \Delta y_{j-1})$, and the vector $(\Delta x_i, \Delta y_j)$ for the coordinates $(x_{Bi}, y_{Bj})=(x_i+\Delta x_i, y_j+\Delta y_j)$ with i that is an odd number ($1\le i$) and j that is an even number ($2\le j$) is equal to the vector $(\Delta x_{i+1}, \Delta y_{j-1})$ but is different from the vector $(\Delta x_{i-1}, \Delta y_{j+1})$, the vector $(\Delta x_{i+1}, \Delta y_{j+1})$, and the vector $(\Delta x_{i-1}, \Delta y_{j-1})$.

According to the semiconductor light emitting element, zero-order light that should be conventionally present at the center of output light disappears. With brightness on both sides thereof, light including a dark line with no zero-order light is output.

Considering the relationship between a wave number and a frequency of laser light, in a case where a wave number k and a frequency f of laser light to be output in the thickness direction of the phase modulation layer satisfy the following condition: $f>m\times|k|$ where $m>0$, zero-order light of the laser light to be emitted perpendicularly to a light emitting face of the phase modulation layer satisfies the following condition: $f\le m\times|k|$, and the different refractive index regions are arranged such that the laser light includes a dark line without the zero-order light.

Effects of Invention

A semiconductor light emitting element according to the present invention is capable of forming an unprecedented useful beam pattern.
For example, laser light including a dark line with no zero-order light, in combination with a photonic crystal surface emitting laser (PCSEL) that outputs only zero-order light, can be applied to a light source module capable of changing the pattern intensity ratio between at the center and out of the center.

BRIEF DESCRIPTION OF DRAWINGS

FIG. 3 is a table showing the material, conductivity type, and thickness of each layer included in the semiconductor light emitting element.

FIG. 5 explanatorily illustrates the angle of each different refractive index region in the phase modulation layer.

FIG. 9 shows output patterns with the phase modulation layer having the lattice constant for Γ point and M point (FIGS. 9-(A) and 9-(B)).

FIG. 14 explanatorily illustrates the arrangement of different refractive index regions according to the embodiment (FIGS. 14-(A) and 14-(B)).

FIG. 16 is a table showing various relational expressions.

DESCRIPTION OF EMBODIMENTS

A semiconductor light emitting element according to an embodiment will be described below. Note that the same elements are denoted with the same reference signs, and thus the duplicate descriptions thereof will be omitted.

Figure 1:
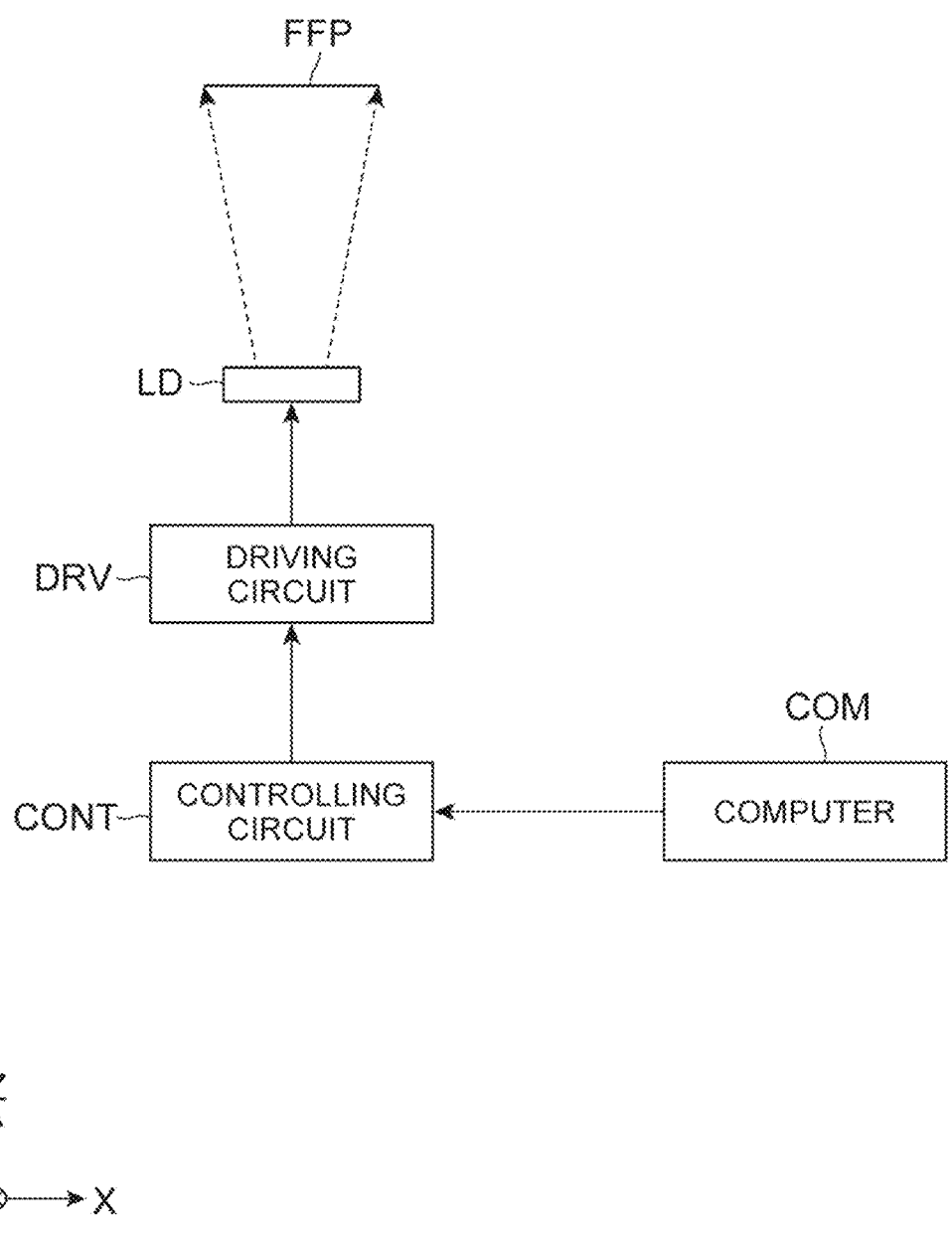
FIG. 1 illustrates the system configuration of a laser device with a semiconductor light emitting element.

FIG. 1 illustrates the system configuration of a laser device with the semiconductor light emitting element.

A semiconductor laser element LD is driven by a driving circuit DRV that outputs a pulse-wave driving current or a continuous-wave driving current. The driving circuit DRV supplies the driving current to each individual semiconductor laser element LD, in accordance with an instruction from a controlling circuit CONT. A computer COM inputs a driving signal into the controlling circuit CONT, so that the controlling circuit CONT generates a square-wave signal instructed by the driving signal. For example, the controlling circuit CONT can be achieved with a counter. The square-wave signal output from the controlling circuit CONT is input into the gate of a transistor included in the driving circuit DRV, so that the driving current flows between the source and the drain of the transistor. Because the source and the drain of the transistor are connected with the electrodes at both ends of the semiconductor laser element LD (anode and cathode), the semiconductor laser element LD is supplied with the driving current, so that the semiconductor laser element LD emits light.

Note that, in a case where the semiconductor laser elements LD are arranged two-dimensionally and are driven, the circuit structures described above can be arranged in a matrix.

The laser light output from the semiconductor laser element LD forms a far-field pattern FFP on a projection plane at a small distance. Because a near-field pattern is formed at the light emitting face of the semiconductor laser element LD, the far-field pattern FFP is approximately a pattern in which the near-field pattern is Fourier-transformed.

The structure of the semiconductor laser element for use in the laser device described above will be described in detail below. The laser element is capable of emitting laser light having various intensity patterns.

Figure 2:
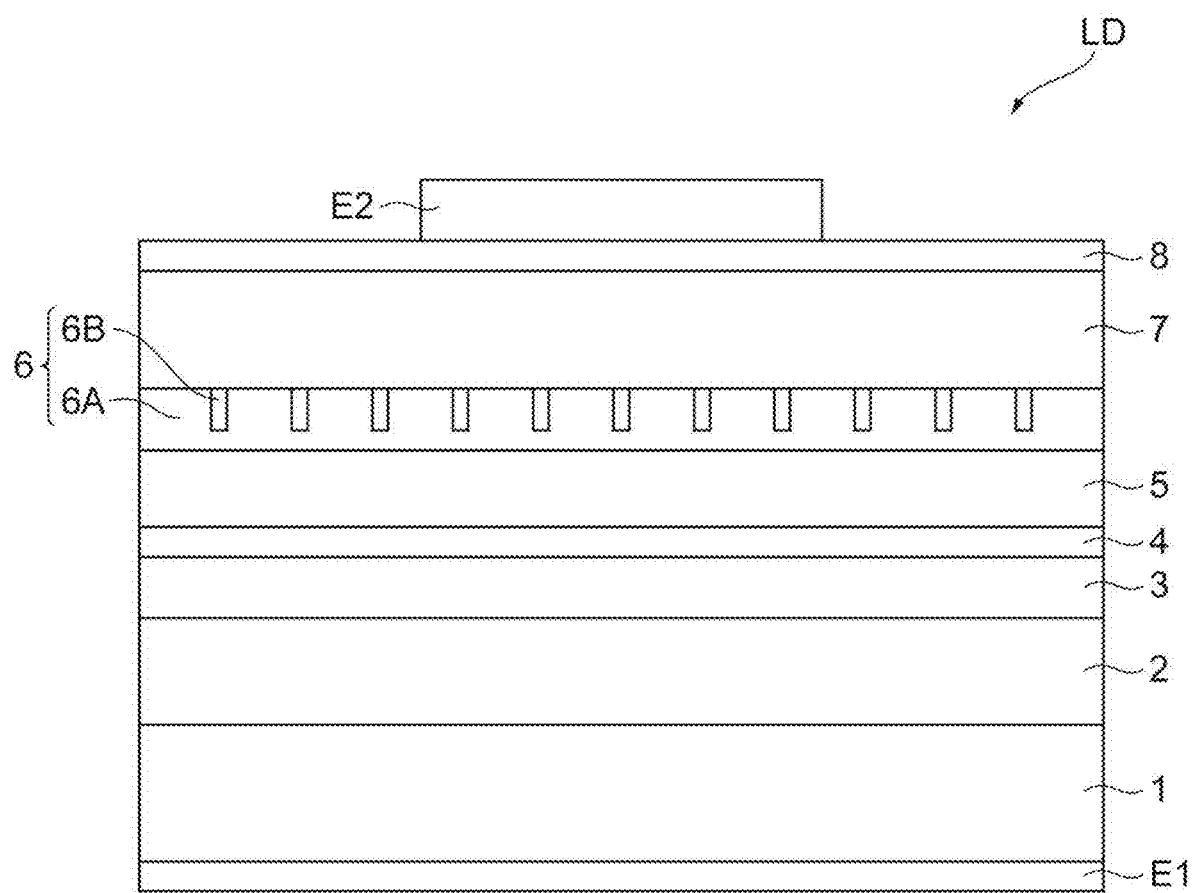
FIG. 2 illustrates the longitudinal sectional configuration of the semiconductor light emitting element.

FIG. 2 illustrates the longitudinal sectional configuration of the semiconductor laser element LD.

The semiconductor laser element LD selectively emits laser light from an active layer 4, outward. The laser light having entered a phase modulation layer 6 from the active layer 4 forms a predetermined mode corresponding to the lattice of the phase modulation layer 6, in the phase modulation layer 6. Then, the laser light is emitted as a laser beam having a desired pattern, outward perpendicularly from the surface of the phase modulation layer 6.

The semiconductor laser element LD is a laser light source that forms a standing wave in the XY in-plane direction and outputs a plane wave phase-controlled in the Z direction. The semiconductor laser element LD includes: the active layer 4 that generates laser light; an upper cladding layer 7 and a lower cladding layer 2 between which the active layer 4 is interposed; and a lower light guide layer 3 and an upper light guide layer 5 between which the active layer 4 is interposed, provided between the upper cladding layer 7 and the lower cladding layer 2, in which the phase modulation layer 6 optically coupled to the active layer 4 is provided between the upper cladding layer 7 and the active layer 4. Note that, in the structure illustrated in FIG. 2, a second electrode E2 is provided in the central region of a contact layer 8.

In the structure, the lower cladding layer 2, the lower light guide layer 3, the active layer 4, the upper light guide layer 5, the phase modulation layer 6, the upper cladding layer 7, and the contact layer 8 are stacked in this order on a semiconductor substrate 1. A first electrode E1 is provided on the lower face of the semiconductor substrate 1, and the second electrode E2 is provided on the upper face of the contact layer 8. In a case where the driving current is supplied between the first electrode E1 and the second electrode E2, recombination of electrons and holes occurs in the active layer 4, so that the active layer 4 emits light. The carriers contributing to the light emission and the generated light are efficiently trapped between the lower light guide layer 3 and the upper light guide layer 5, and between the lower cladding layer 2 and the upper cladding layer 7.

The laser light emitted from the active layer 4 enters inside the phase modulation layer 6, to form the predetermined mode. Note that the phase modulation layer 6 includes: a base layer 6A made of a first refractive index medium; and different refractive index regions 6B that are different in refractive index from the base layer 6A, the plurality of different refractive index regions 6B being made of a second refractive index medium different in refractive index from the first refractive index medium. A group of the plurality of different refractive index regions 6B has a substantially periodic structure. The laser light having entered the phase modulation layer 6 is emitted as the laser beam outward perpendicularly to the substrate surface, through the upper cladding layer 7, the contact layer 8, and the upper electrode E2.

In a case where the effective refractive index of the phase modulation layer 6 is defined as n, a wavelength $\lambda_0$ (=a×n) that the phase modulation layer 6 selects is included in the emission wavelength range of the active layer 4. The phase modulation layer (diffraction grating layer) is capable of selectively outputting the wavelength $\lambda_0$ from the emission wavelengths of the active layer, outward.

FIG. 3 is a table showing the material, conductivity type, and thickness of each layer included in the semiconductor light emitting element.

For the respective materials of the elements as shown in FIG. 3, the semiconductor substrate 1 is made of GaAs, the lower cladding layer 2 is made of AlGaAs, the lower light guide layer 3 is made of AlGaAs, the active layer 4 has a multiple quantum well structure MQW (barrier layer made of AlGaAs and well layer made of InGaAs), the upper light guide layer 5 has a lower layer made of AlGaAs and an upper layer made of GaAs, the phase modulation layer (refractive index modulation layer) 6 has the base layer 6A made of GaAs and the different refractive index regions (buried layers) 6B buried in the base layer 6A, made of AlGaAs, the upper cladding layer 7 is made of AlGaAs, and the contact layer 8 is made of GaAs.

Note that, as shown in FIG. 3, each layer is doped with a first conductivity type (N-type) impurity or a second conductivity type (P-type) impurity (impurity concentration is $1 \times 10^{17}$ to $1 \times 10^{21}/cm^3$), and a region doped with neither of the impurities intentionally is intrinsic (I-type). The impurity concentration of the I-type is $1 \times 10^{15}/cm^3$ or less.

The energy band gap of the cladding layer is set larger than the energy band gap of the light guide layer, and the energy band gap of the light guide layer is set larger than the energy band gap of the well layer in the active layer 4. Changing the composition ratio of Al in AlGaAs enables the energy band gap and the refractive index to be changed easily. Decreasing (increasing) the composition ratio X of Al having a relatively small atomic radius in $Al_XGa_{1-X}As$, causes decrease (increase) of the energy band gap having a positive correlation with the composition ratio X of Al. InGaAs formed by mixture of GaAs and In having a large atomic radius, has a small energy band gap. That is the composition ratio of Al of the cladding layer is larger than the composition ratio of Al of the light guide layer, and the composition ratio of Al of the light guide layer is not less than the composition ratio of Al of the barrier layer (AlGaAs) in the active layer. The composition ratio of Al of the cladding layer is set at 0.2 to 0.4, but is set at 0.3 in the present example. The composition ratio of Al of the light guide layer and the composition ratio of Al of the barrier layer in the active layer are set at 0.1 to 0.15, but are set at 0.3 in the present example. The composition ratio of Al of the light guide layer and the composition ratio of Al of the barrier layer in the active layer are set at 0.1 to 0.15, but are set at 0.1 in the present example.

For the respective thicknesses of the layers as shown in FIG. 3, each numerical range in the table indicates preferable values, and the numerical values in parentheses indicate optimum values. The phase of the laser light to be emitted as the plane wave in the Z direction from the phase modulation layer, depends on the characteristic of the phase modulation layer, and thus functions as the phase modulation layer.

Note that the phase modulation layer 6 may be provided between the lower cladding layer 2 and the active layer 4. In this case, the phase modulation layer 6 can be arranged so as to be interposed between the lower cladding layer 2 and the light guide layer 3. The structure has an effect similar to that described above. That is the laser light emitted from the active layer 4 enters inside the phase modulation layer 6 to form the predetermined mode. The laser light having entered the phase modulation layer 6 is emitted as the laser beam perpendicularly to the substrate surface, through the lower light guide layer, the active layer 4, the upper light guide layer 5, the upper cladding layer 7, the contact layer 8, and the upper electrode E2. Note that the laser beam inclining from the direction perpendicular to the substrate surface can be emitted. Note that, if provided is any structure including the phase modulation layer 6 and the active layer 4 between the upper cladding layer 7 and the lower cladding layer 2, even any other conventionally known structure enables acquisition of a similar effect.

Note that deformation in electrode shape enables the laser light to be emitted from the lower face of the substrate. That is, in a case where the first electrode E1 has an opening in the region opposed to the second electrode E2, on the lower face of the semiconductor substrate 1, the laser beam is emitted outward from the lower face. In this case, the first electrode E1 provided on the lower face of the semiconductor substrate 1 is an aperture electrode having a central portion provided with an opening. An antireflection film may be provided in the opening of the first electrode E1 and therearound. In this case, the antireflection film is a dielectric single-layer film, such as silicon nitride (SiN) or silicon dioxide ($SiO_2$), or a dielectric multi-layer film. Examples of the dielectric multi-layer film that can be used, include an appropriately layered film of two types or more of dielectric layers selected from a dielectric layer group including titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$). For example, a film having a thickness of $\lambda/4$ as an optical thickness to light having a wavelength $\lambda$ is layered. Note that a reflective film or an antireflection film can be formed by sputtering.

Although the second electrode E2 is provided on the upper face of the contact layer 8, any region except the region in which the contact electrode E2 is formed can be as necessary covered with an insulating film, such as $SiO_2$ or silicon nitride, resulting in protection of the surface.

Note that, for the structure described above, holes are periodically formed at a plurality of portions of the base layer 6A by etching, and then the different refractive index regions 6B can be buried in the formed holes by metalorganic chemical vapor deposition, sputtering, or epitaxy. After the burying of the different refractive index regions 6B in the holes of the base layer 6A, furthermore, a different refractive index covering layer identical in material to the different refractive index regions 6B may be deposited on the different refractive index regions 6B.

Figure 4:
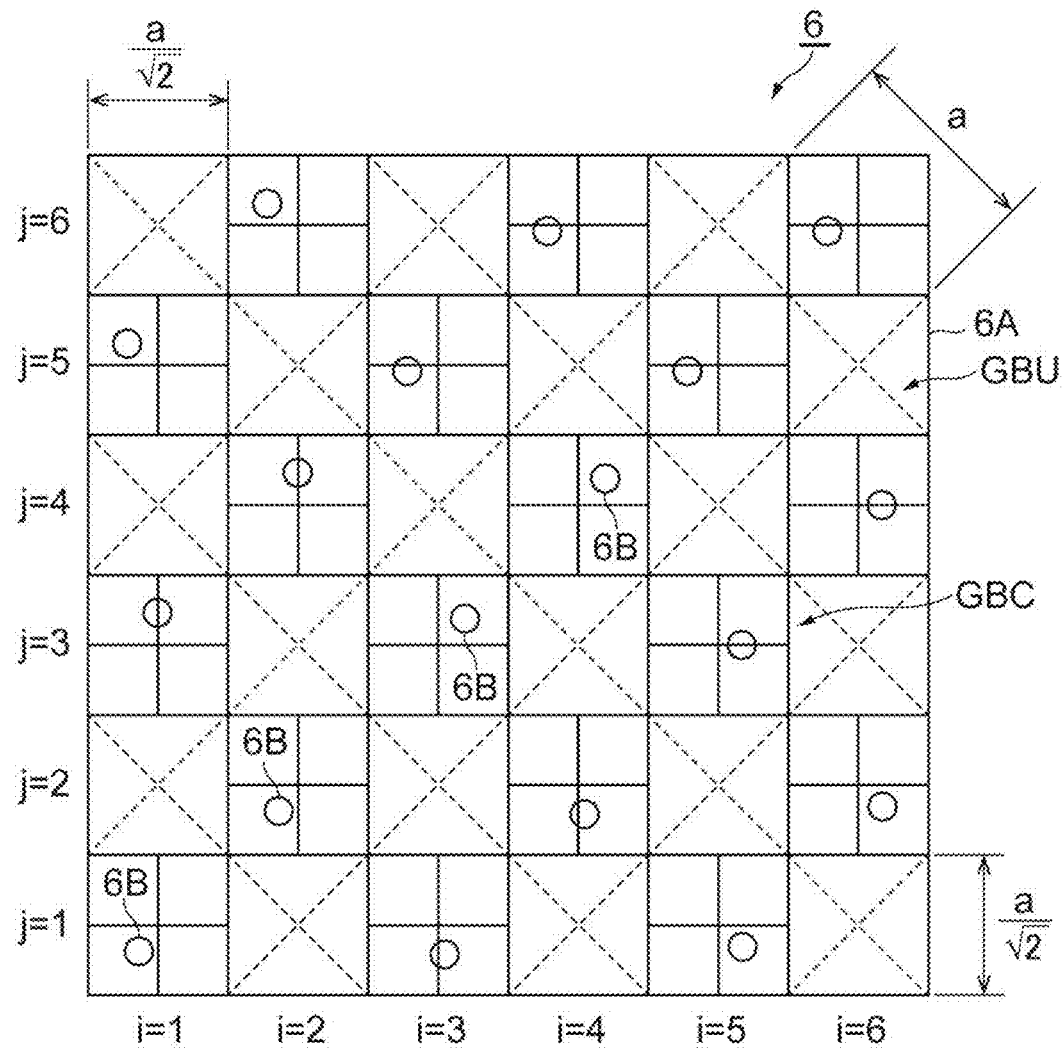
FIG. 4 illustrates the plan configuration of a phase modulation layer.

FIG. 4 illustrates the plane configuration (XY plane) of the phase modulation layer 6. Note that, in the figure, an XYZ orthogonal coordinate system is set in which the thickness direction of the phase modulation layer 6 is the Z-axis direction.

The phase modulation layer 6 includes the base layer 6A and the plurality of different refractive index regions 6B different in refractive index from the base layer 6A. The plurality of different refractive index regions 6B is buried in the base layer 6A, but the positions thereof cannot be expressed by a single period. For the phase modulation layer 6, a second virtual square lattice (GBU) and a first virtual square lattice (grid for calculation) (GBC) are set in the XY plane. Note that the first virtual square lattice (GBC) is formed of a plurality of lines extending in the X-axis direction and a plurality of lines extending in the Y-axis direction, and the shape of a unit lattice is a square.

The pitch in the X-axis direction of the first virtual square lattice (GBC) is defined as $\alpha/\sqrt{2}$. The pitch in the Y-axis direction of the first virtual square lattice (GBC) is defined as $\alpha/\sqrt{2}$. The XY coordinates of the barycentric position of the opening (unit lattice) of the first virtual square lattice (GBC) is defined as $(x_i, y_j)$. The figure illustrates six openings arranged in the lateral direction (i=6) and six openings arranged in the longitudinal direction (j=6).

Meanwhile, the second virtual square lattice (GBU: indicated with dotted lines) for regulation of the positions of the different refractive index regions in the phase modulation layer 6 are formed of a constant-pitch straight-line group expressed by $Y=X+y_a$ ($y_a$ represents the value of the intercept on the Y axis of the straight line) and a constant-pitch straight-line group expressed by $Y=-X+y_b$ ($y_b$ represents the value of the intercept on the Y axis of the straight line). The shape of each unit lattice is identical to a shape resulting from rotation of a square having sides parallel to the X axis, by 45°. Each side of such a unit lattice has a length of $\alpha$.

The lattice pitch of the first virtual square lattice (GBC) whose grid lines are parallel to the X axis or the Y axis is $\alpha/\sqrt{2}$ longitudinally and laterally. Thus, the position of the grid line in the longitudinal direction (X-axis direction) satisfies the following expression: $X=\alpha/\sqrt{2}\times i$, and the position of the grid line in the lateral direction (Y-axis direction) satisfies the following expression: $Y=\alpha/\sqrt{2}\times j$.

The XY coordinates $(x_i, y_j)$ of the barycentric position of the opening (unit lattice) of the first virtual square lattice (GBC) is as follows (note that i and j are integers):

XY coordinates $(x_i, y_j)=((i-0.5)\alpha/\sqrt{2}, (j-0.5)\alpha/\sqrt{2})$

The barycentric position of each different refractive index region 6B is shifted from the barycentric position of an opening (one unit lattice) of the first virtual square lattice (GBC). For each different refractive index region 6B, the angle between the shift direction of the barycentric position of the different refractive index region 6B from the barycentric position of the closest opening (one unit lattice) of the first virtual square lattice (GBC) and the X axis is defined as an angle φ. The angle φ of the shift direction in each opening has the value of one of a plurality of different angles, such as φA, φB, φC, φD, φE, φF, φG, φH, and φI.

FIG. 5 explanatorily illustrates the angle of each different refractive index region in the phase modulation layer.

In the figure, the distribution of the angles φ of the different refractive index regions 6B in the phase modulation layer 6 illustrated in FIG. 4 is indicated with symbols. That is, the different refractive index regions 6B are arranged checkerwise in a group of the openings of the first virtual square lattice (GBC), and the shift angle of each different refractive index region 6B is set at, for example, φA, φB, φC, φD, φE, φF, φG, φH, or φI. Note that, as illustrated in FIGS. 4 and 5, the unit lattice of the first virtual square lattice (GBC) completely included in each unit lattice of the second virtual square lattice (GBU) indicated with the dotted lines, satisfies condition (1) where i is an even number and j is an even number or condition (2) where i is an odd number and j is an odd number. In a case where neither of the conditions is satisfied, the first virtual square lattice includes no different refractive index region 6B. Therefore, the XY coordinates $(x_i, y_j)$ of the center of the unit lattice of the first virtual square lattice (GBC) is as follows (note that i and j are integers, j is an even number only when i is an even number, and j is an odd number only when i is an odd number):

XY coordinates $(x_i, y_j)=((i-0.5)\alpha/\sqrt{2}, (j-0.5)\alpha/\sqrt{2})$

For example, the different refractive index region 6B having φE is present in the unit lattice at the position (i=3, j=3), and the different refractive index region 6B identical in angle to the different refractive index region 6B having φE is present in the unit lattice at the position (i=4, j=4). Here, although four unit lattices (i, j)=(2, 2), (2, 4), (4, 2), (4, 4) are present closest to the unit lattice at the position (i=3, j=3), only the unit lattice (i, j)=(4, 4) has the different refractive index region 6B identical in angle to that of the unit lattice (i, j)=(3, 3). In other words, the different refractive index region 6B having φE is present in the unit lattice (i, j)=(3, 3) and the unit lattice (i, j)=(4, 4). With respect to the unit lattice (i, j)=(3, 3), due to parallel translation, the unit lattice (i, j)=(3, 3) coincides with the upper-right unit lattice in the closest four unit lattices. However, even when parallel translation is carried out in the other three directions, the unit lattice (i, j)=(3, 3) does not coincide with any of the other unit lattices. With respect to the unit lattice (i, j)=(4, 4), due to parallel translation, the unit lattice (i, j)=(4, 4) coincides with the lower-left unit lattice in the closest four unit lattices. However, even when parallel translation is carried out in the other three directions, the unit lattice (i, j)=(4, 4) does not coincide with any of the other unit lattices. Furthermore, in other words, each unit lattice coincides with only one of the closest four unit lattices but does not coincide with the other three.

The position of the different refractive index region 6B will be further described below.

Figure 6:
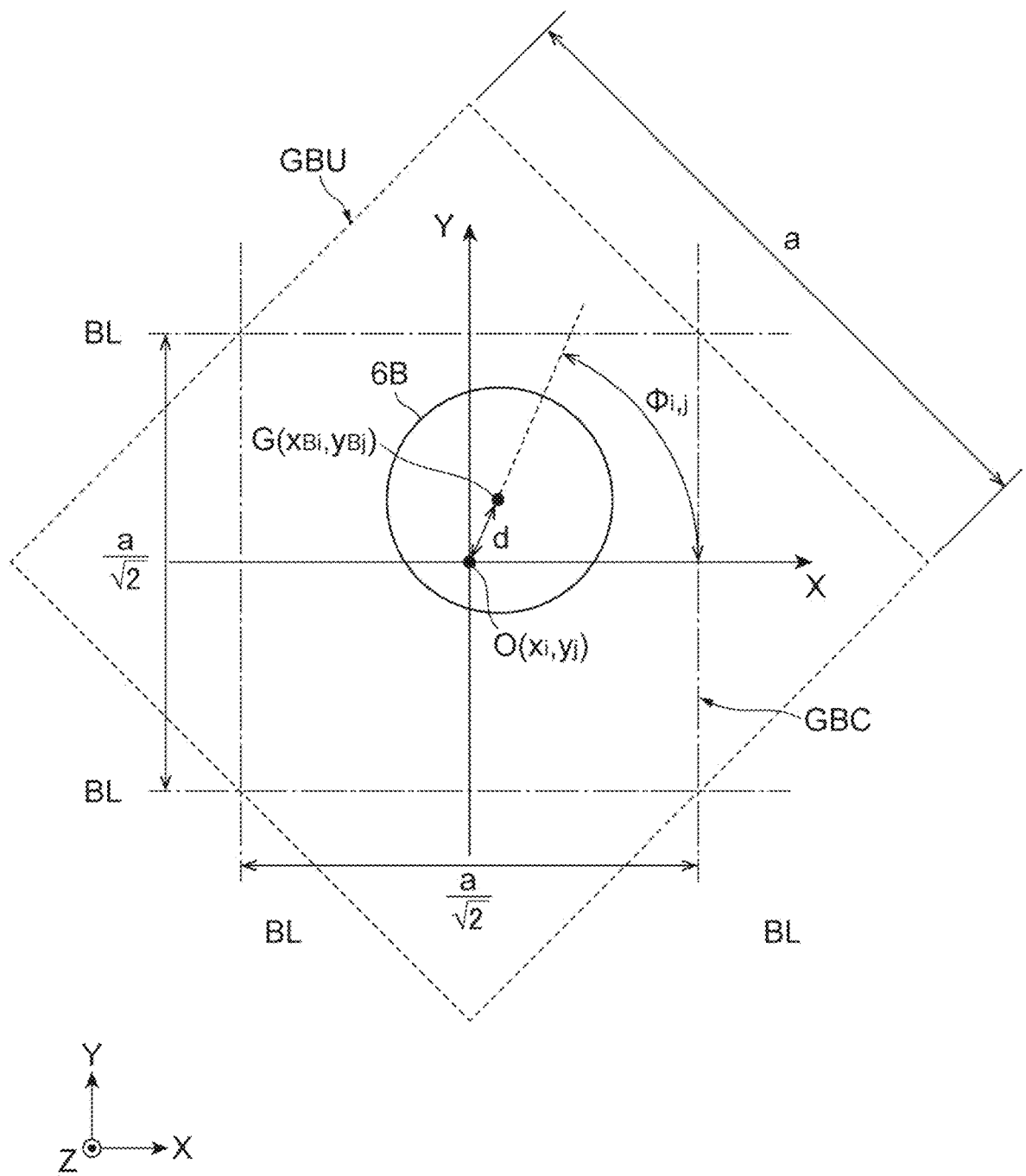
FIG. 6 explanatorily illustrates the shift amount of the different refractive index region from the barycentric position of one lattice frame.

FIG. 6 explanatorily illustrates the shift amount of the different refractive index region 6B from the barycentric position in one opening (one lattice frame) in the square lattice.

The second virtual square lattice (GBU) is formed of a plurality of straight lines extending obliquely (indicated with dotted lines). A plurality of straight lines extending along the X axis or the Y axis (indicated with dot-and-dash lines) expresses the boundary lines BL of the first virtual square lattice (GBC). One opening is a region surrounded by four boundary lines BL for the first virtual square lattice, and the center thereof is the barycentric position $O(x_i, y_j)$ of the opening. FIG. 6 illustrates the unit lattice of the second virtual square lattice (GBU). Each side of the unit lattice of the second virtual square lattice (GBU) has a length of α.

The barycentric position $O(x_i, y_j)$ of the unit lattice of the second virtual square lattice (GBU) coincides with the barycentric position $O(x_i, y_j)$ of the unit lattice of the first virtual square lattice (GBC). A vector is defined to indicate the position of the different refractive index region 6B in the unit lattice. The vector connecting the XY coordinates $(x_{Bi}, y_{Bj})$ of the barycentric position G of an arbitrary different refractive index region 6B and the barycentric position $O(x_i, y_j)$ of the unit lattice, directed from the XY coordinates $(x_i, y_j)$ of the center of the unit lattice to the XY coordinates $(x_{Bi}, y_{Bj})$ of the barycentric position of the different refractive index region 6B, is defined as $(\Delta x_i, \Delta y_j)$.

Note that the angle $\varphi_{i,j}$ of the vector satisfies the following expression: $\varphi_{i,j}=\tan(\Delta y_j/\Delta x_i)=((y_{Bj}-y_j)/(x_{Bi}-x_i))$. Note that satisfaction of $(x_{Bi}-x_i)=0$ and $(y_{Bj}-y_j)>0$ results in $\varphi_{i,j}=\pi/2$ and satisfaction of $(x_{Bi}-x_i)=0$ and $(y_{Bj}-y_j)<0$ results in $\varphi_{i,j}=3\pi/2$.

For the checkered arrangement illustrated in FIG. 5, the different refractive index region 6B is present in the opening of the unit lattice of the first virtual square lattice (GBC) included in the unit lattice of the square lattice (GBU). In a case where i and j each is an odd number or in a case where i and j each is an even number, the different refractive index region 6B is present in the opening of the first virtual square lattice, and otherwise no different refractive index region 6B is present. Specifically, in a case where the coordinates $(x_{Bi}, y_{Bj})$ of the barycentric position of the different refractive index region 6B is present with i that is an odd number, the coordinates $(x_{Bi}, y_{Bj})$ of the barycentric position of an arbitrary different refractive index region 6B is present only in a case where i is an odd number and j is an odd number and in a case where i is an even number and j is an even number. In FIG. 5, the angle φ is φA for i=1 and j=1, and similarly the angle φ is φA for i=2 and j=2. Briefly, the vector $(\Delta x_i, \Delta y_j)$ for i=1 and j=1 is equal to the vector $(\Delta x_{i+1}, \Delta y_{j+1})$ for i=2 and j=2.

In a case where i and j each is three or more, the following condition is satisfied. That is, for each opening including the different refractive index region 6B in the openings of the first virtual square lattice, the vector $(\Delta x_i, \Delta y_j)$ for the coordinates $(x_{Bi}, y_{Bj})=(x_i+\Delta x_i, y_j+\Delta y_j)$ is equal to one of the vectors included in the closest four unit lattices, but is different from the other three.

For example, in FIG. 5, focusing on the opening frame having φE (i=3, j=3), similarly, φE is satisfied at the upper-right opening frame (i=4, j=4). The vector indicated at φE for (i, j)=(3, 3) is equal to the vector (at an angle of φE)

for (i, j)=(4, 4), but is different from the vector at the angle φ in each of the other unit lattices closest to (i, j)=(3, 3). That is, although the unit lattices (i, j)=(2, 2), (4, 2), (4, 4), (2, 4) are closest to the unit lattice (i, j)=(3, 3), only the unit lattice (4, 4) therefrom is equal in angle φ to the unit lattice (i, j)=(3, 3), and the different refractive index region is present at a different angle in each of the other unit lattices.

According to the semiconductor laser element, zero-order light that should be conventionally present at the center of the output light disappears. With brightness on both sides thereof, light including a dark line with no zero-order light is output (refer to FIG. 9-(B)).

The disappearance of the zero-order light will be examined below.

Figure 7:
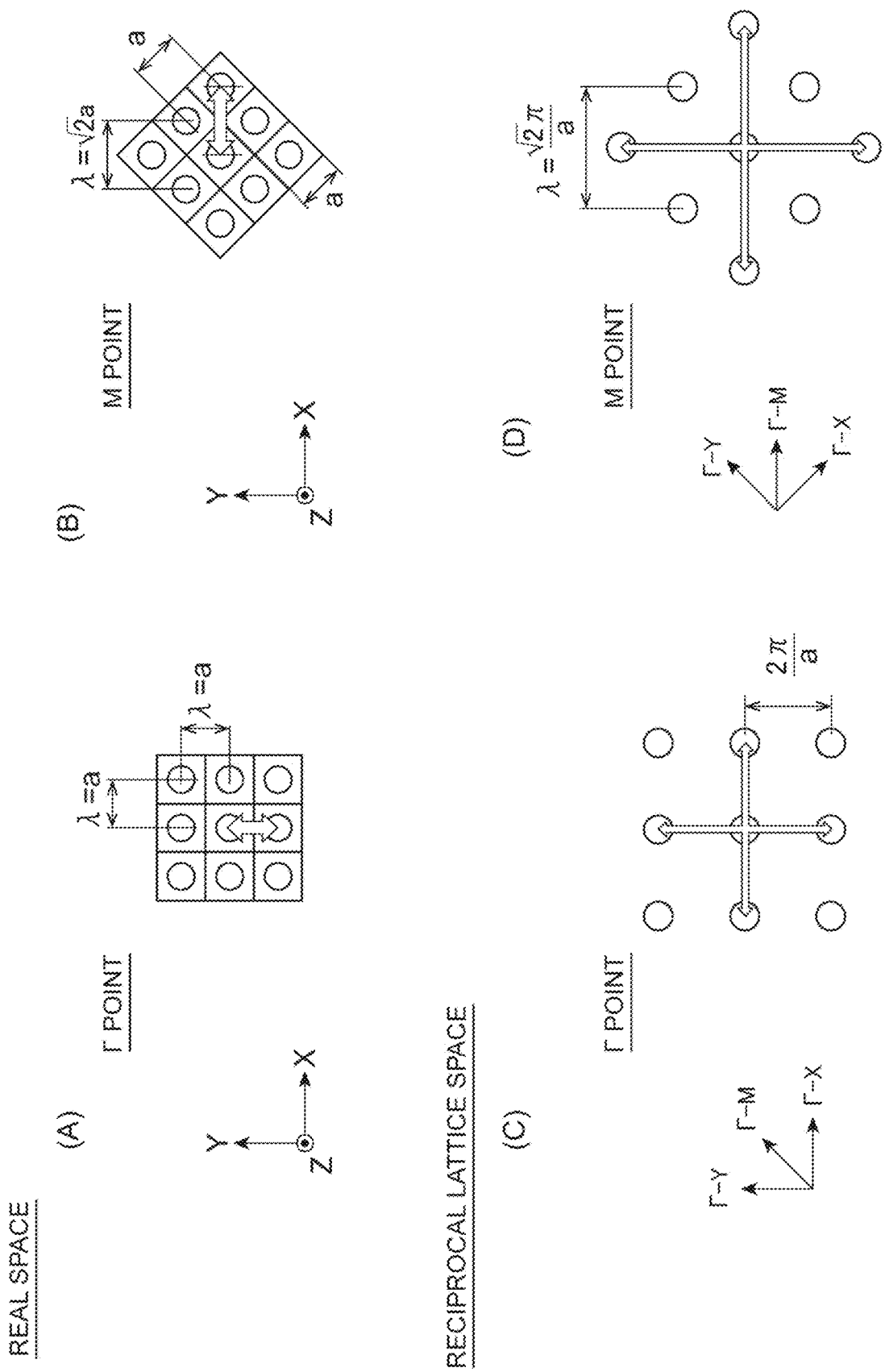
FIG. 7 explanatorily illustrates Γ point and M point in real space and in reciprocal lattice space (FIGS. 7-(A), 7-(B), 7-(C), and 7-(D)).

FIG. 7 explanatorily illustrates Γ point and M point in real spaces (A) and (B) and in reciprocal lattice spaces (C) and (D). Each circle in the figure indicates the different refractive index region described above.

FIG. 7-(A) illustrates the different refractive index region located at the center of the opening of a lattice frame in the square lattice in the real space set with an XYZ three-dimensional orthogonal coordinate system. The lattice pitch of the square lattice is α, and the barycentric pitch between adjacent different refractive index regions in the X-axis direction or in the Y-axis direction is α. Light emission at Γ point in the phase modulation layer occurs in a case where $\lambda/n$ coincides with α, where λ represents emission wavelength and n represents the effective refractive index in the phase modulation layer to the output light. In this case, the laser light is emitted in the Z-axis direction. FIG. 7-(C) illustrates the reciprocal lattice of the lattice of FIG. 7-(A). Although the pitch between adjacent different refractive index regions along the longitudinal direction (Γ-Y) or along the lateral direction (Γ-X) is $2\pi/\alpha$, $2\pi/\alpha$ coincides with $(2n\pi/\lambda)$ (n is the effective refractive index of the phase modulation layer).

FIG. 7-(B) illustrates the different refractive index region located at the center of the opening of a lattice frame in the square lattice in the real space set with an XYZ three-dimensional Cartesian coordinate system. The lattice pitch of the square lattice is a, and the barycentric pitch between adjacent different refractive index regions in the X-axis direction or in the Y-axis direction is $\sqrt{2}\cdot\alpha$. The value $\lambda/n$ resulting from the emission wavelength λ divided by the effective refractive index n, is a multiplied by $\sqrt{2}$ ($2\lambda/n=\alpha\times 2^{0.5}$). In this case, light emission at M point occurs in the phase modulation layer. FIG. 7-(D) illustrates the reciprocal lattice of the lattice of FIG. 7-(B). The pitch between adjacent different refractive index regions along the Γ-M direction is $(2^{0.5}\pi)/\alpha$ that coincides with $(2n\pi/\lambda)$ (n is the effective refractive index of the phase modulation layer). Note that solid-white arrows in FIG. 7 indicate the direction in which a light wave oscillates.

The oscillation will be described in detail.

Γ-point oscillation with a perturbation of 0, namely, satisfaction of d=0 (refer to FIG. 6) corresponds to the Γ-point oscillation of the square lattice, as illustrated in FIG. 7-(C). As illustrated in the figure, the wave vector of a fundamental wave orients in the lateral direction (Γ-X direction) and in the longitudinal direction (Γ-Y direction) in the plane of the phase modulation layer 6. In a case where the distance d is not zero, namely, deviation is made from each barycentric position in the square lattice, part of the standing wave generated in the plane is emitted outward from the substrate surface as the laser beam having a desired pattern that is a beam having a spread perpendicularly to the substrate surface. In a case where the effective refractive index of the phase modulation layer 6 is defined as n, a wavelength $\lambda_0(=\alpha\times n)$ that the phase modulation layer 6 selects is included in the emission wavelength range of the active layer 4. The phase modulation layer (diffraction grating layer) is capable of selectively outputting the wavelength $\lambda_0$ from the emission wavelengths of the active layer, outward.

Meanwhile, for M-point oscillation, as illustrated in FIG. 7-(D), the vector of the fundamental wave of laser oscillation (direction of the fundamental wavelength λ) is rotated by 45° in comparison with the case of FIG. 7-(C). That is the vector orients in the Γ-M direction, instead of in the Γ-X direction or in the Γ-Y direction.

Figure 8:
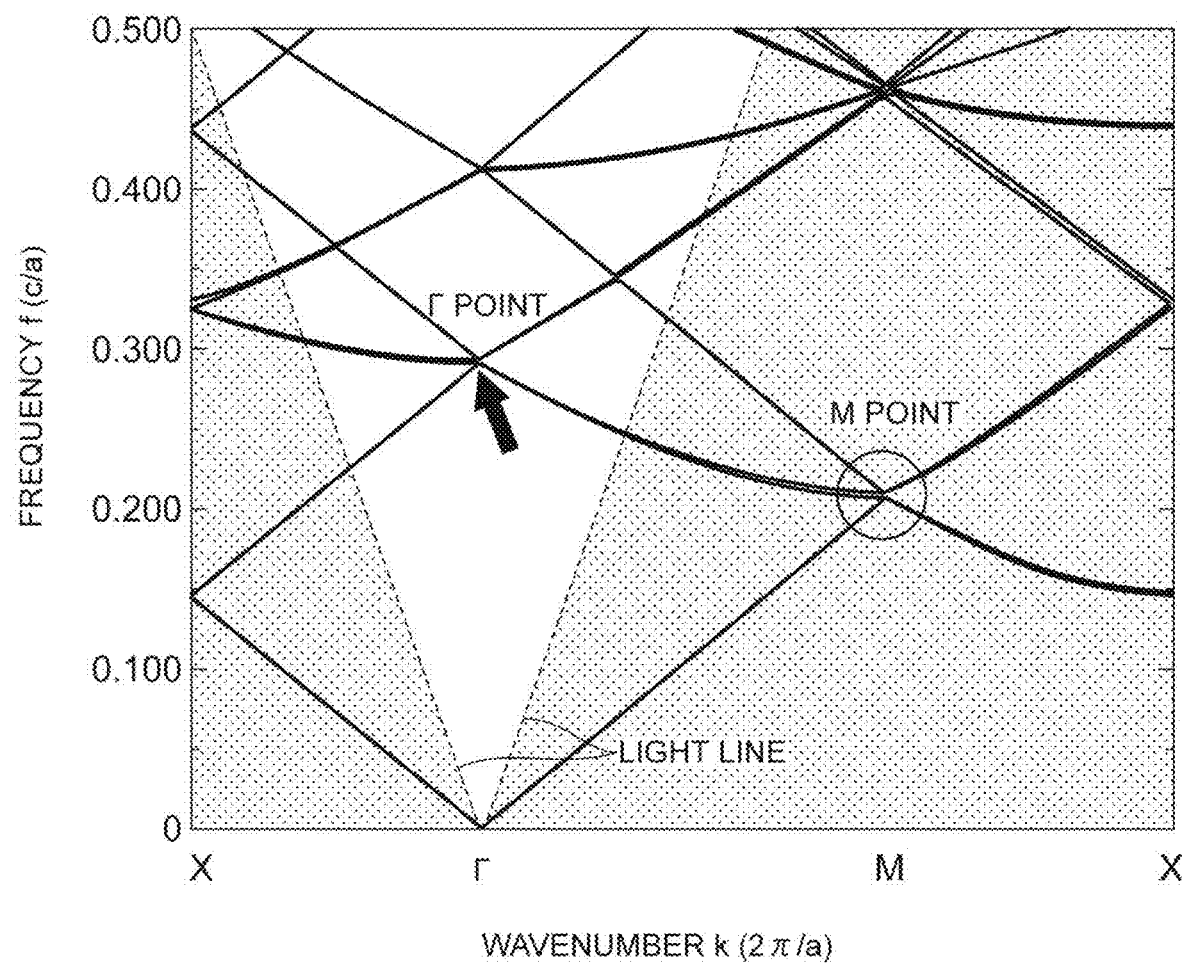
FIG. 8 is a graph showing the relationship between wave number k (a.u.) and frequency (c/α).

FIG. 8 is a graph showing the relationship between the normalized in-plane wave number k $(2\pi/\alpha)$ and the frequency f $(c/\alpha)$ of the laser light. Note that c represents the speed of light and α represents the lattice constant of the square lattice (GBU of FIG. 6) in the phase modulation layer. The wave number and the frequency of the semiconductor laser element for Γ point illustrated in FIG. 7-(A), corresponding to a point indicated as Γ point in FIG. 8, are located on the upper side of two dotted lines (light lines). When the laser light is output in the air, the laser light is not subjected to total reflection, so that light output is acquired in the plane perpendicular direction. Meanwhile, the wave number and the frequency of the semiconductor laser element for M point are located on the lower side of the two dotted lines (light lines) in FIG. 8. When the laser light is output in the air, total reflection occurs. In a case where the different refractive index regions are arranged regularly in a square lattice form satisfying M point, no light output is acquired in the plane perpendicular direction.

That is, for the semiconductor laser element described above, the XYZ orthogonal coordinate system is set in which the thickness direction of the phase modulation layer is the Z-axis direction. The second virtual square lattice is set in the XY plane. The lattice constant α of the square lattice satisfies the following expression: $\alpha=\lambda/(2^{0.5}n)$ where λ represents the emission wavelength. A pair of adjacent different refractive index regions in the phase modulation layer with a pitch of α between the adjacent different refractive index regions is arranged so as to coincide with each other in a case where shifting is made by the pitch of α only in one direction and so as not to coincide with each other in the other directions.

Considering the relationship between the in-plane wave number k and the frequency $f=(c/\alpha)$ of the laser light, the light lines indicated with the dotted lines of FIG. 8 are given by $f=m\times|k|$ (note that m>0) M point is present on the lower side of the right-side light line, and Γ point at which the laser light is emitted is present on the upper side of the light lines. Therefore, in a case where the wave number k and the frequency f of the laser light to be output in the thickness direction of the phase modulation layer satisfy the following condition: $f>m\times|k|$ where m>0, as the condition of satisfaction of the region including Γ point on the upper side of the light lines, the zero-order light of the laser light to be emitted perpendicularly to the light emitting face of the phase modulation layer satisfies the following condition: $f\leq m\times k$. The plurality of different refractive index regions is arranged such that the laser light includes a dark line with no zero-order light.

An exemplary arrangement of the plurality of different refractive index regions can be acquired by inverse operation from a far-field pattern as below.

FIG. 9 shows output patterns with the phase modulation layer having the lattice constant for Γ point (A) and M point (B).

As shown in FIG. 9-(A), in a case where the phase modulation layer is provided such that a lattice pattern is projected on a projection plane with Γ point, a spot of the zero-order light appears at the center of the output pattern. The pattern of the phase modulation layer with Γ point can be acquired as follows: The far-field pattern (lattice pattern) on the projection plane is inversely Fourier-transformed by projection to wave number space. The barycentric position of the different refractive index region is shifted by the distance d at the angle φ from the barycentric position of the opening of the second virtual square lattice (or first virtual square lattice) in the phase modulation layer, namely, the different refractive index region is arranged such that the function of the vector $(\Delta x_i, \Delta y_j)$ is satisfied.

Figure 10:
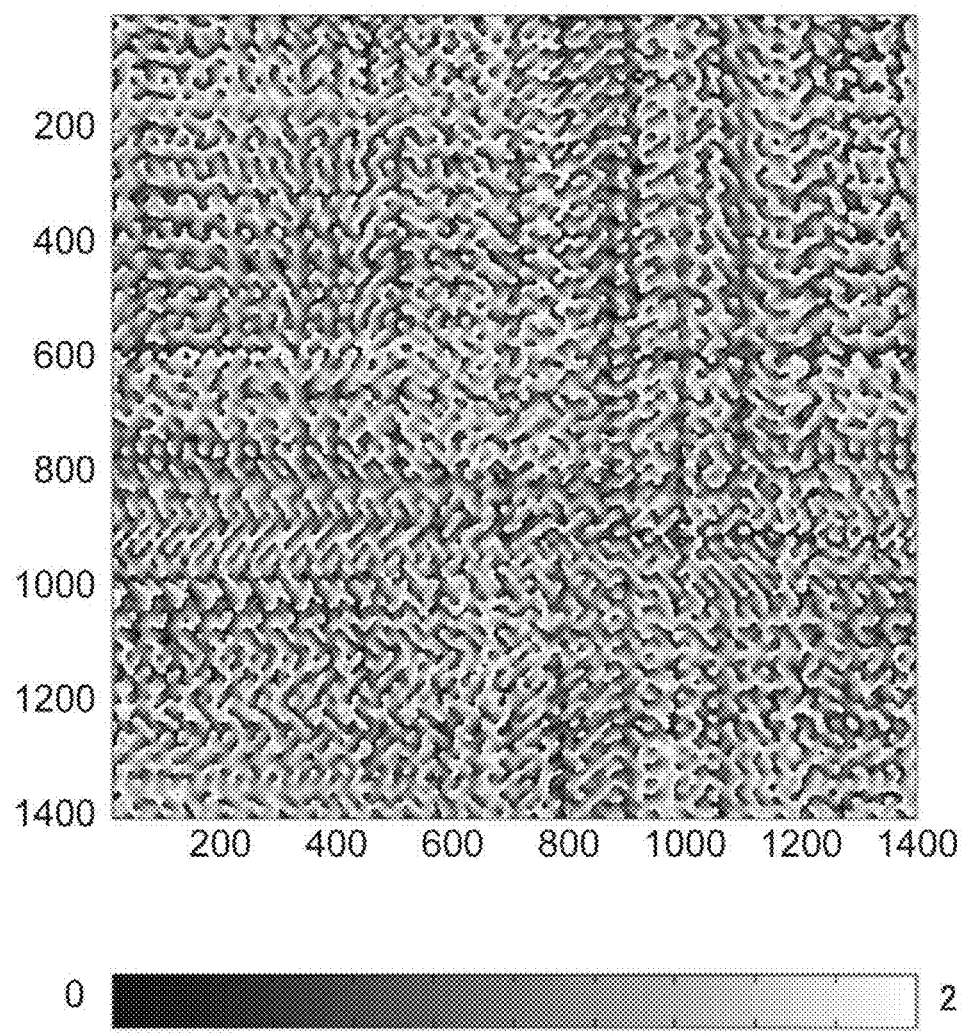
FIG. 10 shows a phase distribution in the phase modulation layer.

FIG. 10 shows a phase distribution in the phase modulation layer. Numerals of 200 to 1400 denoted around the figure indicate the coordinates of pixels on the monitor of the computer, and indicate that pixels of 1400×1400 are displayed. A bar with gradation on the lower side of FIG. 10 indicates the value of a phase θ. The black at the position of zero at the left end indicates the phase θ=0(radian), and the white at the position of 2π it indicates the phase θ=2π (radian). Note that the phase θ here is the phase of light included in the phase term P of the complex amplitude F of light in a case where an optical pattern is two-dimensionally inversely Fourier-transformed to the unit configuration region R(x, y) on the X-Y plane of the phase modulation layer, similarly to the case of FIG. 12-(3).

As shown in FIG. 9-(B), in a case where the phase modulation layer is provided such that a lattice pattern excluding the zero-order light is projected on the projection plane, the pattern of the phase modulation layer is set as below. That is, for the pattern of the phase modulation layer with M point, first, the far-field pattern (lattice pattern) on the projection plane is inversely Fourier-transformed by projection to the wave number space, and then the pattern of the phase modulation layer is formed, similarly to the case of FIG. 9-(A). Next, a pattern in which the pattern of the phase modulation layer is doubled in size in the X-axis direction and in the Y-axis direction is background-set. Then, a lattice frame (opening) in which nothing is present is arranged between adjacent different refractive index regions in the X-axis direction and a lattice frame (opening) in which nothing is present is arranged between adjacent different refractive index regions in the Y-axis direction such that the different refractive index regions are present checkerwise. Thus, the zero-order light disappears on the projection plane, resulting in acquisition of a far-field pattern including a dark line obliquely.

Figure 11:
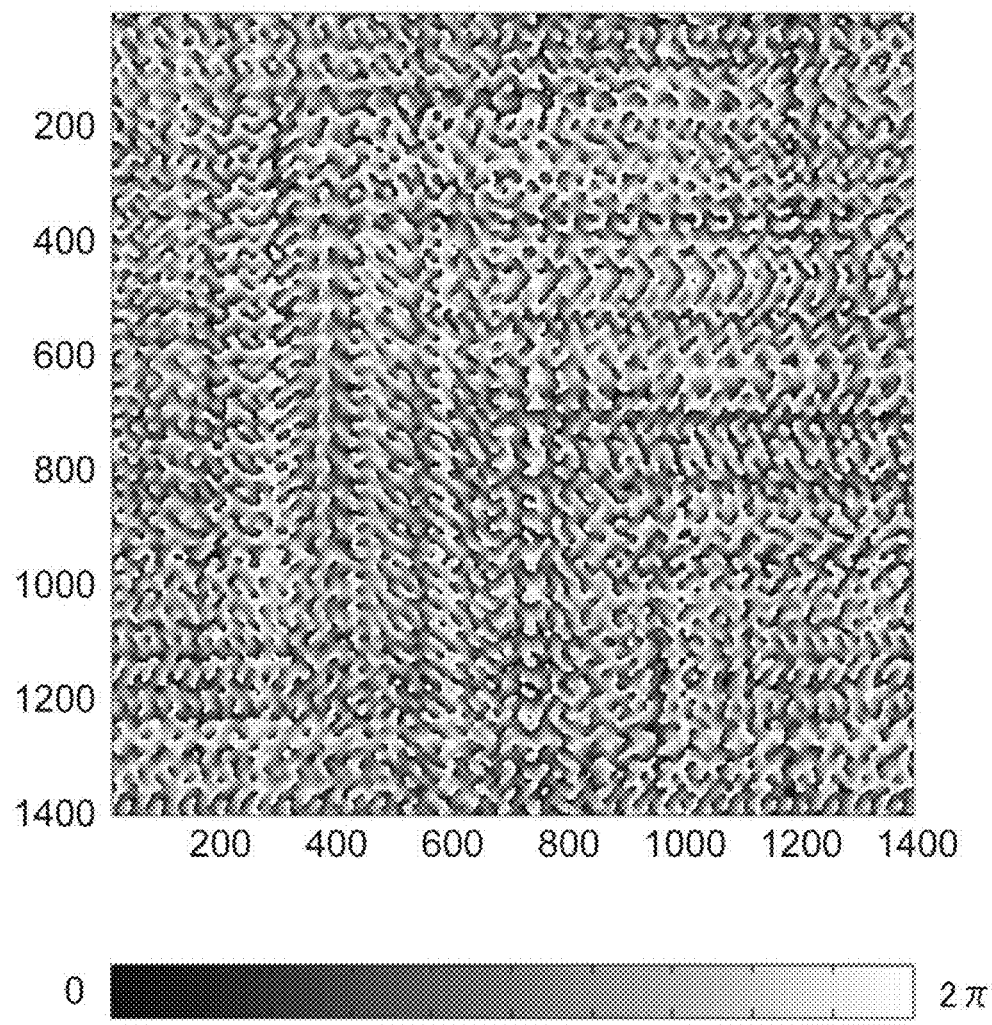
FIG. 11 shows a phase distribution in the phase modulation layer.

FIG. 11 shows a phase distribution in the phase modulation layer. Numerals of 200 to 1400 denoted around the figure indicate the coordinates of pixels on the monitor of the computer, and indicate that pixels of 1400×1400 are displayed. A bar with gradation on the lower side of FIG. 11 indicates the value of the phase θ of the complex amplitude of an optical pattern inversely Fourier-transformed on the phase modulation layer, similarly to the case of FIG. 10.

Note that, for the far-field pattern of the laser light emitted from the phase modulation layer, propagation calculation (diffraction calculation) is performed on the complex amplitude distribution of light on the device surface, so that a pattern at an infinite distance (far-field pattern) can be acquired. Note that, for the infinite distance, a result of the diffraction calculation is approximately equal to a result with the Fourier transform. Specifically, Fourier-transforming the complex amplitude distribution of light on the surface of the phase modulation layer (surface of the semiconductor laser element) enables acquisition of the complex amplitude distribution of the far-field pattern. The distribution of intensity of the amplitude term squared after the complex amplitude is divided into the amplitude term and the phase term, is typically measured. Inversely Fourier-transforming the complex amplitude distribution of the far-field pattern enables acquisition of the complex amplitude distribution on the surface of the phase modulation layer. The distribution of "intensity" of the amplitude term squared after the complex amplitude is divided into the amplitude term and the phase term is an intensity distribution to be measured.

Figure 12:
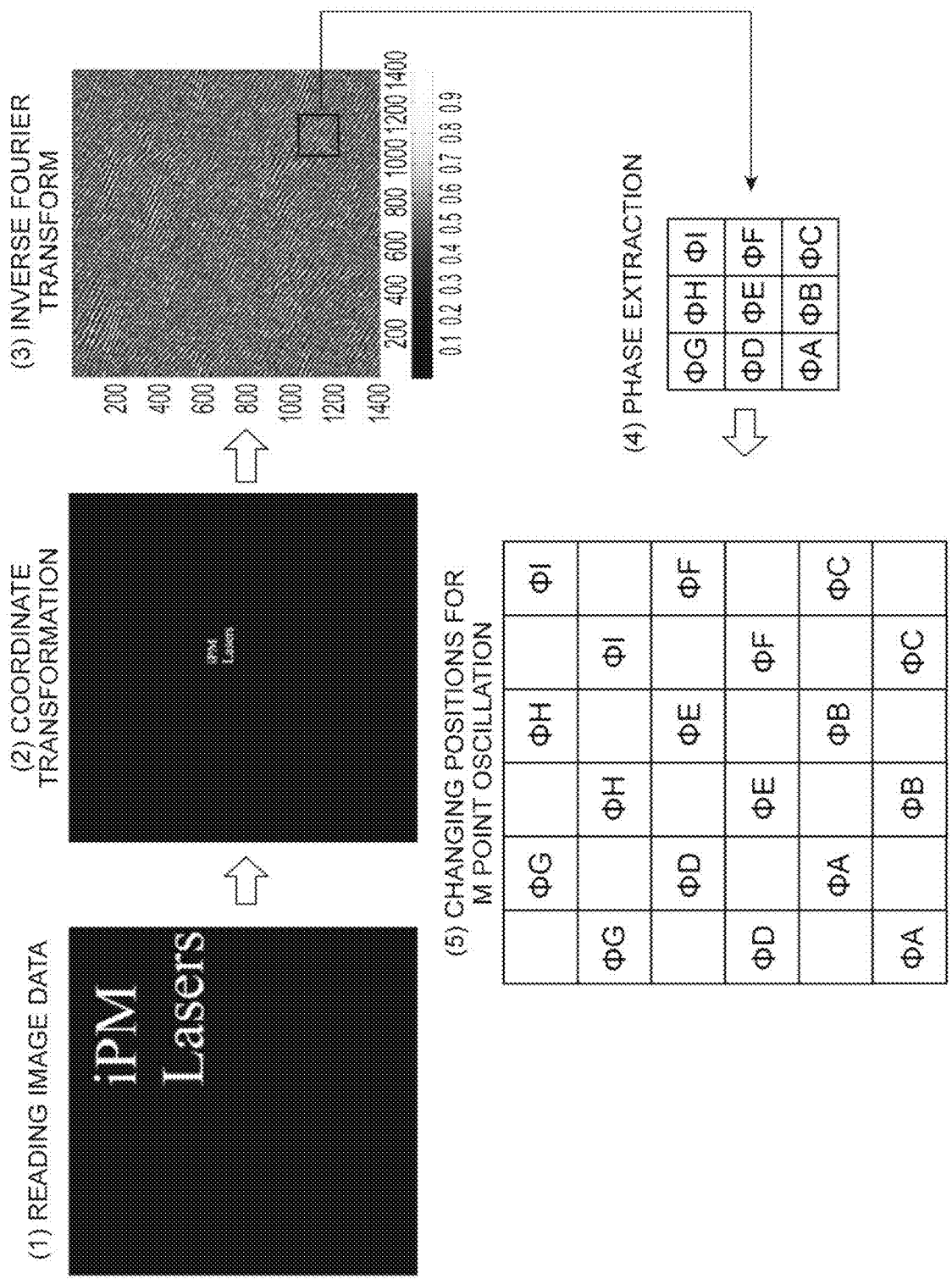
FIG. 12 explanatorily shows the arrangement of different refractive index regions according to an embodiment (FIGS. 12-(1), 12-(2), 12-(3), 12-(4), and 12-(5)).

FIG. 12 explanatorily shows the arrangement of different refractive index regions according to the embodiment.

First, as shown in FIG. 12-(1), a target image (1400 pixels×1400 pixels) to be the far-field pattern is read into a storage device in the computer. Next, as shown in FIG. 12-(2), the tilt angle of each bright point of the target image to the direction perpendicular to the device surface is transformed to the wave number, as indicated by Mathematical Expressions (A4) and (A5) of FIG. 16, so that the target image is expressed as a group of the bright points on the wave number space. As shown in FIG. 12-(3), a step in which the complex amplitude of each bright point expressed on the wave number space is inversely Fourier-transformed to acquire the near-field pattern and then the pattern is Fourier-transformed again to acquire the complex amplitude of each bright point expressed on the wave number space, is repeated about 10 to 1000 times (Gerchberg-Saxton (GS) algorithm) (Mathematical Expressions (A6) to (A8) of FIG. 16). In each step in the repetition, the amplitude distribution is replaced with a target distribution, from the respective complex amplitudes acquired on the wave number space and in the near-field pattern, so that the far-field pattern is close to the target image. The complex amplitude distribution of the near-field pattern acquired after the present step, has an amplitude component and a phase component. Thus, the phase is extracted every coordinates in the near-field pattern (phase distribution), and the angle φ corresponding to the phase is determined.

Figure 17:
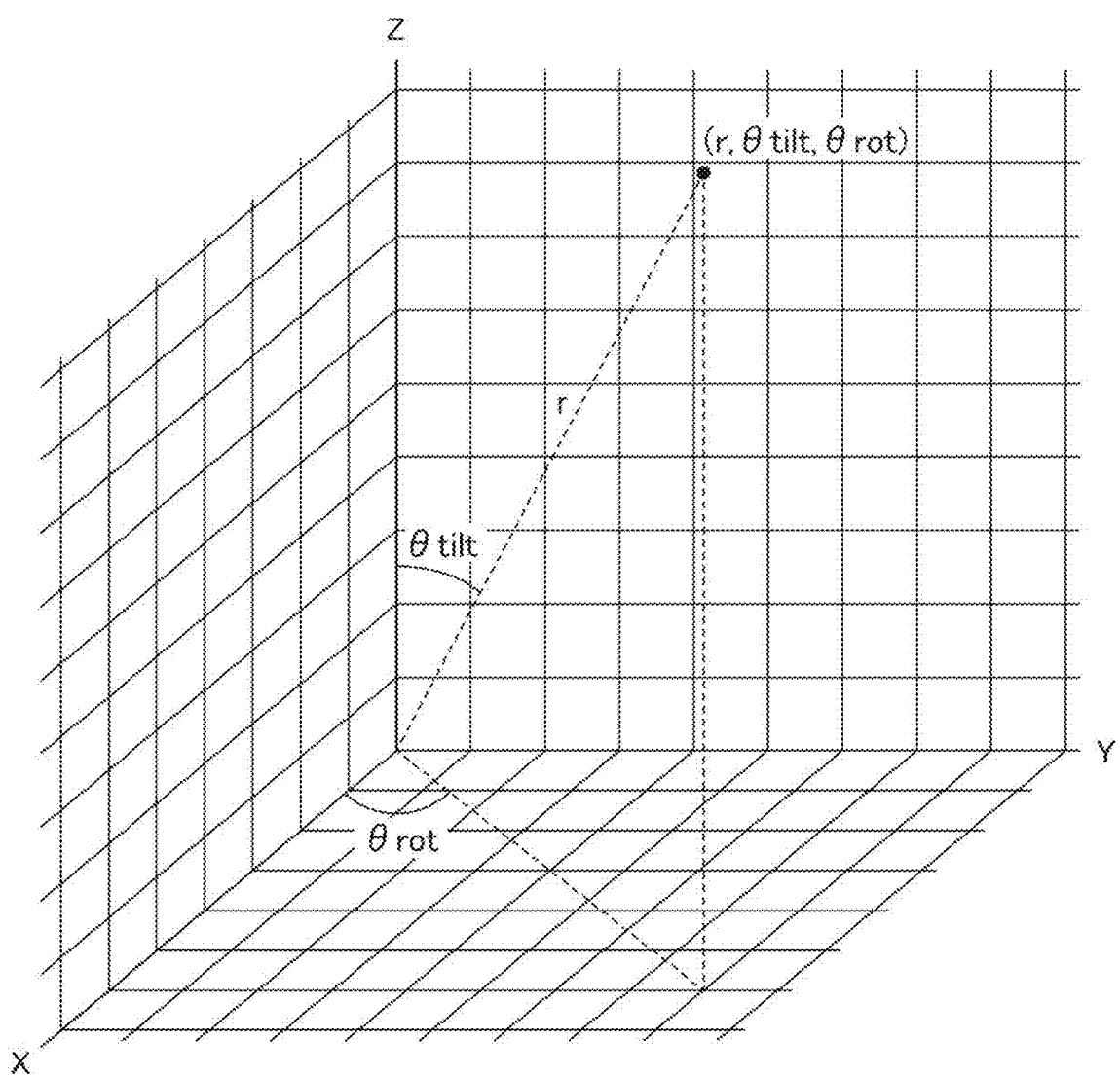
FIG. 17 explanatorily illustrates a coordinate system.

Here, the coordinate system for the description will be organized. The coordinates (x, y, z) in the XYZ orthogonal coordinate system satisfy the relationship indicated by Expressions (A1) to (A3) of FIG. 16, to the spherical coordinates (r, $\theta_{tilt}$, $\theta_{rot}$) regulated by the length r of a radius vector, the tilt angle $\theta_{tilt}$ of the radius vector to the Z axis, and the angle $\theta_{rot}$ of a line segment that is the radius vector projected on the X-Y plane, to the X axis (rotation angle of the line segment to the X axis), as illustrated in FIG. 17. Note that FIG. 17 explanatorily illustrates coordinate transformation from the spherical coordinates (r, $\theta_{tilt}$, $\theta_{rot}$) to the coordinates (x, y, z) in the XYZ orthogonal coordinate system, and the coordinates (x, y, z) express the optical pattern in design on a predetermined plane set in the XYZ orthogonal coordinate system that is real space.

When a beam pattern corresponding to the optical pattern that the semiconductor light emitting element outputs is defined as a group of bright points facing in the direction regulated by the angles $\theta_{tilt}$ and $\theta_{rot}$, the angles $\theta_{tilt}$ and $\theta_{rot}$ are converted to the coordinate value kx that is the normalized wave number regulated by Expression (A4) of FIG. 16, on the Kx axis corresponding to the X axis and the coordinate value ky that is the normalized wave number regulated by Expression (A5) of FIG. 16, on the Ky axis that corresponds to the Y axis and is orthogonal to the Kx axis. Each normalized wave number means a wave number normalized with, as 1.0, a wave number corresponding to the lattice pitch of the second virtual square lattice. In this case, in the wave number space regulated by the Kx axis and the Ky axis, a specific wave number range including the beam pattern corresponding to the optical pattern, is formed of M2 (integer of one or more)×N2 (integer of one or more) number of image regions FR that are square (refer to FIG. 18). Note that the integer M2 does not necessarily coincide with the integer M1. Similarly, the integer N2 does not necessarily coincide with the integer N1.

Expressions (A4) and (A5) of FIG. 16 are disclosed, for example, in Y. Kurosaka et al., "Effects of non-lasing band in two-dimensional photonic-crystal lasers clarified using omnidirectional band structure," Opt. Express 20, 21773-21783 (2012). Note that α and λ in Expressions (A4) and (A5) of FIG. 16 indicate the following parameters.

α: the lattice constant of the second virtual square lattice (GBU) described above
λ: the oscillation wavelength of the semiconductor laser element (light emitting element)

Figure 18:
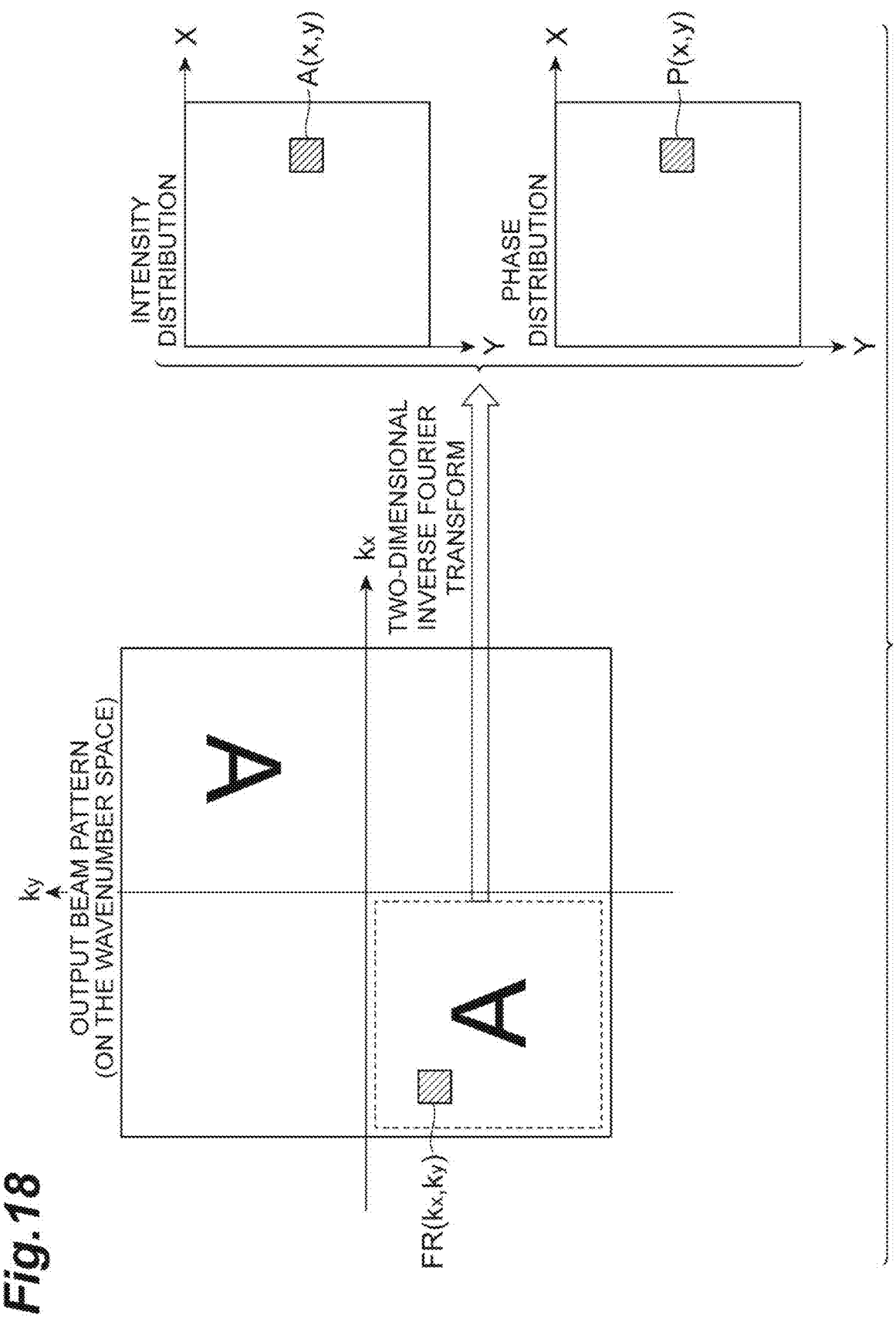
FIG. 18 explanatorily illustrates transformation.

The method described above will be specifically given. FIG. 18 explanatorily illustrates the relationship between the optical pattern corresponding to the beam pattern output from the semiconductor laser element LD and the distribution of the rotation angle φ(x, y) in the phase modulation layer 6. Specifically, the Kx-Ky plane acquired by transforming the plane on which the beam emitted from the semiconductor laser element LD forms the optical pattern (setting plane for the optical pattern in design expressed by the coordinates (x, y, z) in the XYZ orthogonal coordinate system) onto the wave number space, will be considered. The Kx axis and the Ky axis regulating the Kx-Ky plane are orthogonal to each other, and each is associated with the angle to the normal direction at the time when the emission direction of the beam is changed from the normal direction of the principal face of the semiconductor substrate 1 to the principal face, on the basis of Expressions (A1) to (A5) of FIG. 16. On the Kx-Ky plane, a specific region including the beam pattern corresponding to the optical pattern, is formed of M2 (integer of one or more)×N2 (integer of one or more) number of image regions FR that are square. The second virtual square lattice set on the X-Y plane on the phase modulation layer 6 is formed of M1 (integer of one or more)×N1 (integer of one or more) number of unit configuration regions R. Note that the integer M2 does not necessarily coincide with the integer M1. Similarly, the integer N2 does not necessarily coincide with the integer N1. In this case, the complex amplitude F(x, y) in the unit configuration region R(x, y) acquired by two-dimensionally inversely Fourier-transforming each image region FR (kx, ky) on the Kx-Ky plane, specified by the coordinate component kx (integer of from one to M2) in the Kx-axis direction and the coordinate component ky (integer of from one to N2) in the Ky-axis direction, to the unit configuration region R(x, y) specified by the coordinate component x (integer of from one to M1) in the X-axis direction and the coordinate component y (integer of from one to N1) in the Y-axis direction, is given by Expression (A6) of FIG. 16 where j represents the imaginary unit.

When the amplitude term and the phase term are defined as A(x, y) and P(x, y), respectively, in the unit configuration region R(x, y), the complex amplitude F(x, y) is regulated by Expression (A7) of FIG. 16.

As illustrated in FIG. 18, in the range of the coordinate component x=1 to M1 and the coordinate component y=1 to N1, the distribution of the amplitude term A(x, y) in the complex amplitude F(x, y) of the unit configuration region R(x, y) corresponds to the intensity distribution on the X-Y plane. In the range of x=1 to M1 and y=1 to N1, the distribution of the phase term P(x, y) in the complex amplitude F(x, y) of the unit configuration region R(x, y) corresponds to the phase distribution on the X-Y plane. As described below, the rotation angle φ(x, y) in the unit configuration region R(x, y) is acquired from P(x, y). In the range of the coordinate component x=1 to M1 and the coordinate component y=1 to N1, the distribution of the rotation angle φ(x, y) of the unit configuration region R(x, y) corresponds to the rotation angle distribution on the X-Y plane.

Note that the center Q of the output beam pattern on the Kx-Ky plane is located on an axis perpendicular to the principal face of the semiconductor substrate 1. Four quadrants are illustrated with the center Q as the origin in FIG. 18. FIG. 18 illustrates an exemplary case where the optical pattern is acquired in the first quadrant and in the third quadrant. However, the pattern can be acquired in the second quadrant and in the fourth quadrant or in all the quadrants. According to the present embodiment, as illustrated in FIG. 18, the optical pattern having point symmetry with respect to the origin is acquired. FIG. 18 illustrates an exemplary case where a pattern is acquired in which a character "A" and a character "A" rotated by 180° are located in the third quadrant and in the first quadrant, respectively. Note that, for a rotationally symmetric optical pattern (e.g., a cross, a circle, or a double circle), one superimposed optical pattern is observed.

The beam pattern (optical pattern) output from the semiconductor laser element LD corresponds to the optical pattern in design (original image) expressed by at least one of a spot, a straight line, a cross, a line drawing, a lattice pattern, a picture, a banded pattern, computer graphics (CG), and a character. Here, for acquisition of a desired optical pattern, the rotation angle φ(x, y) of the different refractive index region 6B in the unit configuration region R(x, y) is determined in accordance with the following procedure.

As described above, the center of gravity G of the different refractive index region 6B is arranged apart by r(x, y) from the lattice point O(x, y) in the unit configuration region R(x, y). In this case, the different refractive index region 6B is arranged in the unit configuration region R(x, y) such that the rotation angle φ(x, y) satisfies the relationship in Expression (A8) of FIG. 16. Note that, in Expression (A8): φ(x, y)=C×P(x, y)+B, C represents a constant of proportionality and indicates, for example, 180°/π, and B represents an arbitrary constant and indicates, for example, zero. Note that the constant of proportionality C and the arbitrary constant B each have a constant value to any of the unit configuration regions R.

That is, for acquisition of a desired optical pattern, at least, the optical pattern formed on the Kx-Ky plane projected on the wave number space is two-dimensionally inversely Fourier-transformed to the unit configuration region R(x, y) on the X-Y plane on the phase modulation layer 6, and then the rotation angle φ(x, y) corresponding to the phase term P(x, y) of the complex amplitude F(x, y) is given to the different refractive index region 6B arranged in the unit configuration region R(x, y). Note that the far-field pattern two-dimensionally inversely Fourier-transformed of the laser beam can have various shapes, such as a single or multiple spot shape, an annular shape, a linear shape, a character shape, a double annular shape, and Laguerre-Gaussian beam shape. Note that, because the beam pattern is expressed with wave number information on the wave number space (on the Kx-Ky plane), for example, for a bitmap image in which the target beam pattern is expressed with two-dimensional positional information, favorably, the two-dimensionally inverse Fourier transform is carried out after transformation to the wave number information once.

Figure 13:
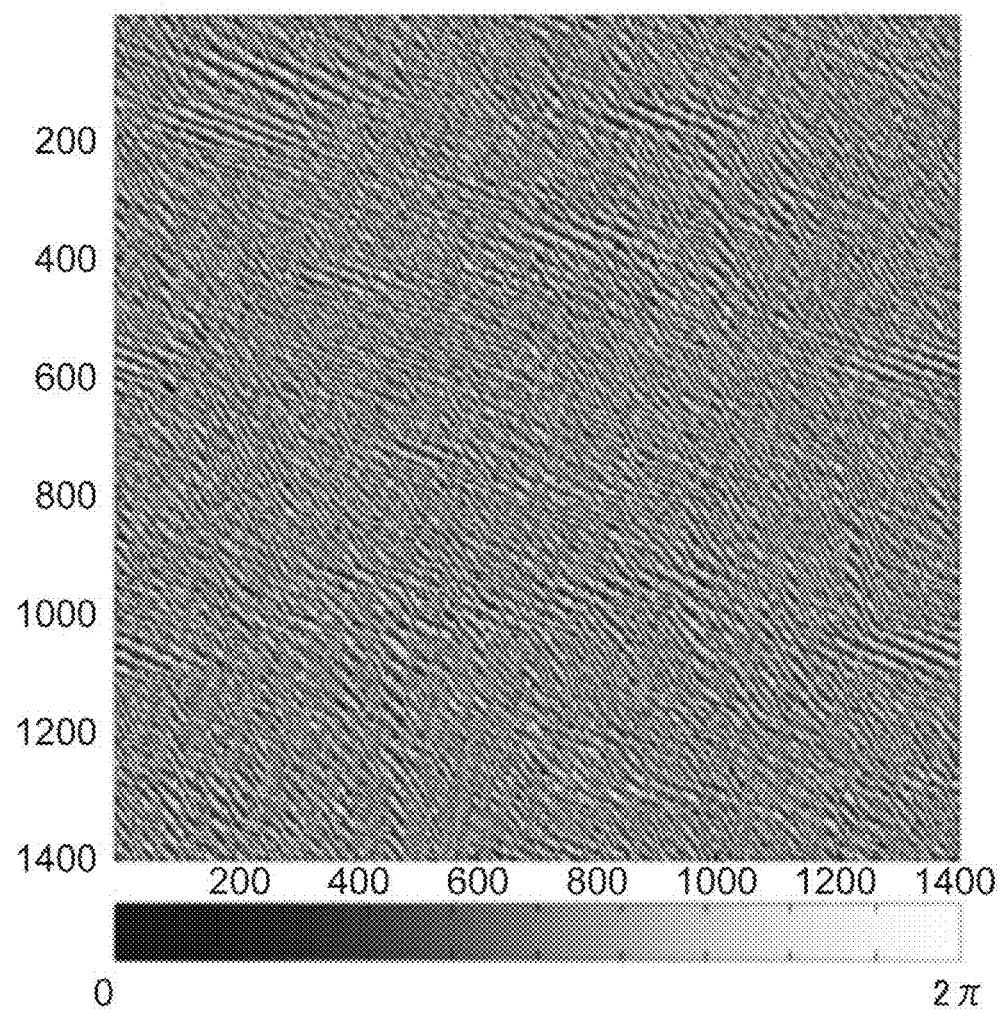
FIG. 13 shows a phase distribution in the phase modulation layer.

As a method of acquiring the intensity distribution and the phase distribution from the complex amplitude distribution on the X-Y plane acquired by the two-dimensionally inverse Fourier transform, for example, the intensity distribution (distribution of the amplitude term A(x, y) on the X-Y plane) can be calculated with the abs function of the MathWorks' numerical analysis software "MATLAB", and the phase distribution (distribution of the phase term P(x, y) on the X-Y plane) can be calculated with the angle function of the MATLAB. FIG. 12-(3) shows the phase distribution. FIG. 13 shows FIG. 12-(3) enlarged. FIG. 13 shows the phase distribution in the phase modulation layer. Numerals of 200 to 1400 denoted around the figure indicate the coordinates of pixels on the monitor of the computer, and indicate that pixels of 1400×1400 are displayed. A bar with gradation on the lower side of FIG. 13 indicates the value of the phase θ. The black at the position of zero at the left end indicates the phase θ=0 (radian), and the white at the position of 2π it indicates the phase θ=2π (radian).

Therefore, in a case where the complex amplitude satisfies (A7) of FIG. 16, the distance d and the angle φ of the different refractive index region illustrated in FIG. 6 need at least to be set on the basis of (A8) of FIG. 16.

Next, as illustrated in FIG. 12-(4), the different refractive index region having the angle φ acquired in that manner is set to the first virtual square lattice (first pattern). Furthermore, as illustrated in FIG. 12-(5), the dimensions in the lateral direction (X-axis direction) and the longitudinal direction (Y-axis direction) of the first pattern and the number of lattice openings are doubled (second pattern). That is, as illustrated in FIG. 12-(5), a lattice opening in which no different refractive index region is present is provided laterally and longitudinally next to each lattice opening in FIG. 12-(4) (refer to FIGS. 4 and 5). Thus, the pitch between each different refractive index region generally satisfies the lattice condition for M point. However, strictly, only a group of paired different refractive index regions in the openings adjacent diagonally right satisfies the lattice condition for M point ($\lambda=\sqrt{2}\times a \times n$ (note that n is the effective refractive index of the phase modulation layer to the output light). Here, the case where a group of paired different refractive index regions in the openings adjacent diagonally right strictly satisfies the lattice condition for M point, has been exemplarily given. However, a group of paired different refractive index regions in the openings adjacent diagonally left, may strictly satisfy the lattice condition for M point. In that case, the dark line flipped horizontally is acquired.

Thus, as described above, the zero-order light disappears, so that the laser light can be acquired in which the dark line is present.

Note that there are other techniques as a technique of transforming arrangement for satisfaction of the lattice condition for M point in FIG. 12-(5).

Figure 14:
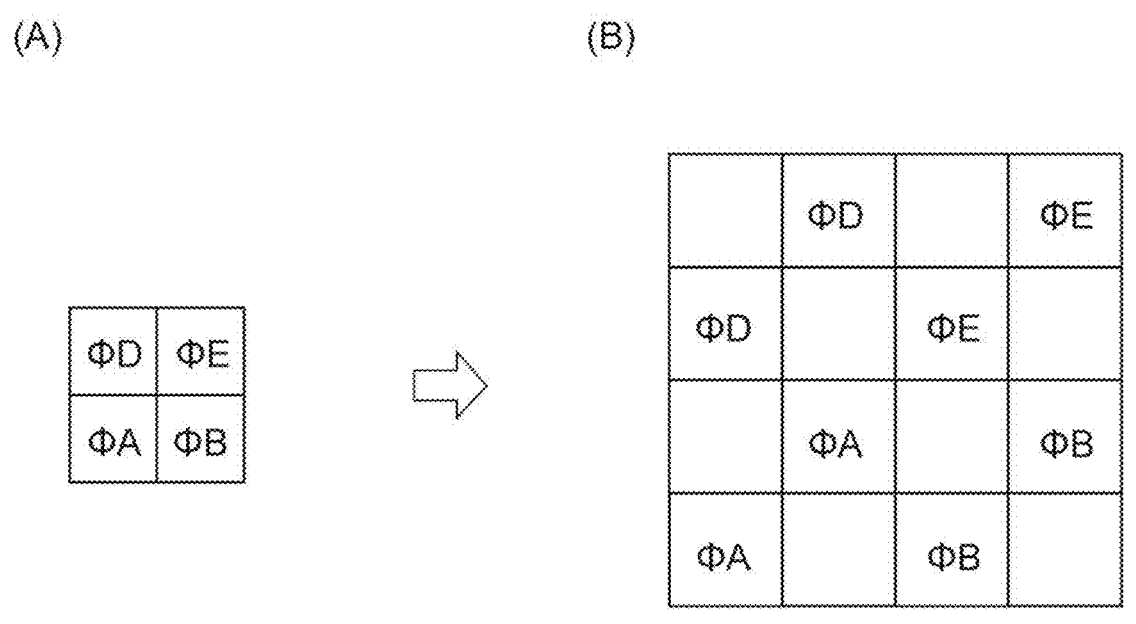

FIG. 14 explanatorily illustrates the arrangement of different refractive index regions according to the embodiment.

For the phase extraction described above, as illustrated in FIG. 14-(A), in a case where the different refractive index regions whose angles φ are φA, φB, φD, and φE are acquired in 2×2 number of lattice frames, the different refractive index regions are set in the second virtual square lattice (first pattern). Furthermore, as illustrated in FIG. 14-(B), the dimensions in the lateral direction (X-axis direction) and the longitudinal direction (Y-axis direction) of the first pattern and the number of lattice openings are doubled. That is, as illustrated in FIG. 14-(B), a lattice opening in which no different refractive index region is present is provided laterally and longitudinally next to each lattice opening in FIG. 14-(A). Thus, the pitch between each different refractive index region generally satisfies the lattice condition for M point. However, strictly, only a group of paired different refractive index regions in the openings adjacent diagonally right satisfies the lattice condition for M point ($\lambda=\sqrt{2}\times a \times n$ (note that n is the effective refractive index of the phase modulation layer to the output light).

Thus, as described above, the zero-order light disappears, so that the laser light can be acquired in which the dark line is present.

Figure 15:
FIG. 15 explanatorily illustrates the arrangement of different refractive index regions according to the embodiment (FIGS. 15-(A) and 15(B)).

FIG. 15 explanatorily illustrates the arrangement of different refractive index regions according to the embodiment.

For the phase extraction described above, as illustrated in FIG. 15-(A), in a case where the different refractive index regions whose angles φ are φA, φB, φD, φE, φG and φH are acquired in 3×2 number of lattice frames, the different refractive index regions are set in the second virtual square lattice (first pattern). Furthermore, as illustrated in FIG. 15-(B), the dimensions in the lateral direction (X-axis direction) and the longitudinal direction (Y-axis direction) of the first pattern and the number of lattice openings are doubled. That is, as illustrated in FIG. 15-(B), a lattice opening in which no different refractive index region is present is provided laterally and longitudinally next to each lattice opening in FIG. 15-(A). Thus, the pitch between each different refractive index region generally satisfies the lattice condition for M point. However, strictly, only a group of paired different refractive index regions in the openings adjacent diagonally right satisfies the lattice condition for M point ($\lambda=\sqrt{2}\times a \times n$ (note that n is the effective refractive index of the phase modulation layer to the output light).

Thus, as described above, the zero-order light disappears, so that the laser light can be acquired in which the dark line is present.

Figure 19:
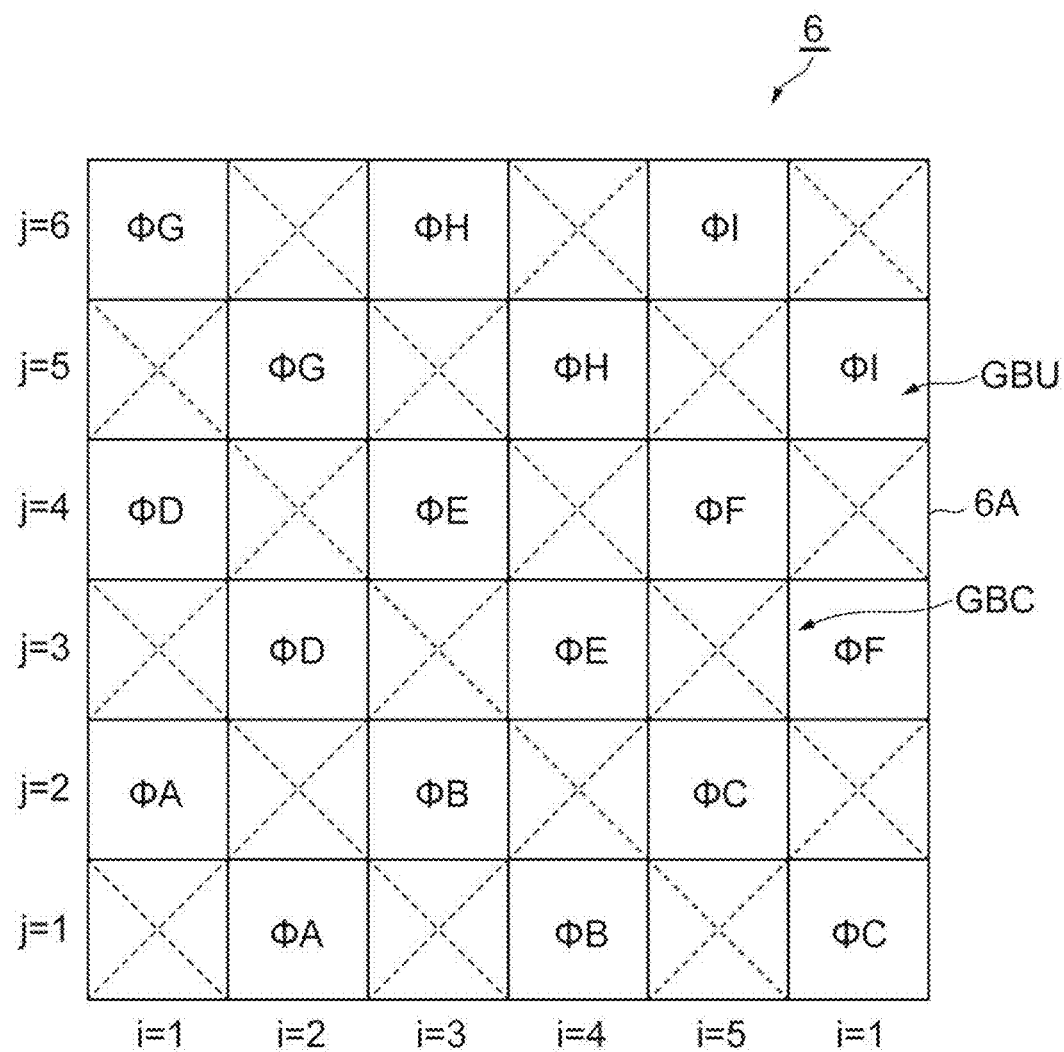
FIG. 19 explanatorily illustrates the angle of each different refractive index region in the phase modulation layer.

Note that FIG. 19 illustrates that the different refractive index regions 6B illustrated in FIG. 5 are changed in arrangement position. In the figure, the distribution of the angles φ of the different refractive index regions 6B in the phase modulation layer 6 illustrated in FIG. 4 is indicated with symbols, similarly to FIG. 5. That is the different refractive index regions 6B are arranged checkerwise in a group of the openings of the first virtual square lattice (GBC), and the shift angle of each different refractive index region 6B is set at, for example, φA, φB, φC, φD, φE, φF, φG, φH, or φI.

Similarly to the case of FIG. 5, the vector connecting the XY coordinates ($x_{Bi}$, $y_{Bj}$) of the barycentric position of an arbitrary different refractive index region 6B and the closest XY coordinates ($x_i$, $y_j$) to the different refractive index region 6B, directed from the XY coordinates ($x_i$, $y_j$) to the XY coordinates ($x_{Bi}$, $y_j$) of the barycentric position of the different refractive index region, is defined as ($\Delta x_i$, $\Delta y_j$). In FIG. 19, the coordinates ($x_{Bi}$, $y_{Bj}$) of the barycentric position of the different refractive index region 6B is present in a case where i+j is an odd number.

Note that, as illustrated in FIG. 19, the unit lattice of the first virtual square lattice (GBC) completely included in each unit lattice of the second virtual square lattice (GBU) indicated with the dotted lines, satisfies condition (1) where i is an even number and j is an odd number or condition (2) where i is an odd number and j is an even number. In a case where neither of the conditions is satisfied, the first virtual square lattice includes no different refractive index region 6B. Therefore, the XY coordinates $(x_i, y_j)$ of the center of the unit lattice of the first virtual square lattice (GBC) is as follows (note that i and j are integers, j is an even number only when i is an odd number, and j is an odd number only when i is an even number):

XY coordinates $(x_i, y_j) = ((i-0.5)a/\sqrt{2}, (j-0.5)a/\sqrt{2})$

Briefly, in a case where i is an even number $(2 \leq i)$ and j is an odd number $(1 \leq j)$, the vector $(\Delta x_i, \Delta y_j)$ for the coordinates $(x_{Bi}, y_{Bj}) = (x_i + \Delta x_i, y_j + \Delta y_j)$ is equal to the vector $(\Delta x_{i-1}, \Delta y_{j+1})$ but is different from the vector $(\Delta x_{i+1}, \Delta y_{j+1})$, the vector $(\Delta x_{i-1}, \Delta y_{j-1})$, and the vector $(\Delta x_{i+1}, \Delta y_{j-1})$.

In a case where i is an odd number $(1 \leq i)$ and j is an even number $(2 \leq j)$, the vector $(\Delta x_i, \Delta y_j)$ for the coordinates $(x_{Bi}, y_{Bj}) = (x_i + \Delta x_i, y_j + \Delta y_j)$ is equal to the vector $(\Delta x_{i+1}, \Delta y_{j-1})$ but is different from the vector $(\Delta x_{i-1}, \Delta y_{j+1})$, the vector $(\Delta x_{i+1}, \Delta y_{j+1})$, and the vector $(\Delta x_{i-1}, \Delta y_{j-1})$ For example, the different refractive index region 6B having φE is present in the unit lattice at the position (i=4, j=3), and the different refractive index region 6B identical in angle to the different refractive index region 6B having φE is present in the unit lattice at the position (i=3, j=4). Here, although four unit lattices (i, j)=(5, 2), (5, 4), (3, 4), (3, 2) are present closest to the unit lattice at the position (i=4, j=3), only the unit lattice (i, j)=(3, 4) has the different refractive index region 6B identical in angle to that of the unit lattice (i, j)=(4, 3). In other words, the different refractive index region 6B having φE is present in the unit lattice (i, j)=(4, 3) and the unit lattice (i, j)=(3, 4). With respect to the unit lattice (i, j)=(4, 3), due to parallel translation, the unit lattice (i, j)=(4, 3) coincides with the upper-left unit lattice in the closest four unit lattices. However, even when parallel translation is carried out in the other three directions, the unit lattice (i, j)=(4, 3) does not coincide with any of the other unit lattices. With respect to the unit lattice (i, j)=(3, 4), due to parallel translation, the unit lattice (i, j)=(3, 4) coincides with the lower-right unit lattice in the closest four unit lattices. However, even when parallel translation is carried out in the other three directions, the unit lattice (i, j)=(3, 4) does not coincide with any of the unit lattices. Furthermore, in other words, each unit lattice coincides with only one of the closest four unit lattices but does not coincide with the other three.

The semiconductor light emitting element having the structure of FIG. 19 is only different in the arrangement of the angle φ from but is identical in the others to that having the structure of FIG. 5. Thus, the semiconductor light emitting element having the structure of FIG. 19 has a similar functional effect except for horizontally flipping of the direction in which the dark line is acquired.

REFERENCE SIGNS LIST 1 semiconductor substrate
2 lower cladding layer
3 lower light guide layer
4 active layer
5 upper light guide layer
6 phase modulation layer
6A base layer
6B different refractive index region
7 upper cladding layer
8 contact layer
COM computer
CONT controlling circuit
DRV driving circuit
E1 electrode
E2 contact electrode
G barycentric position
LD semiconductor laser element

The invention claimed is:

1. A semiconductor light emitting element comprising:
an active layer;
a pair of cladding layers between which the active layer is interposed; and
a phase modulation layer optically coupled to the active layer, wherein
the phase modulation layer includes:
a base layer; and
different refractive index regions that are different in refractive index from the base layer,
an XYZ orthogonal coordinate system is set in which a thickness direction of the phase modulation layer is defined as a Z-axis direction,
a virtual square lattice is set in an XY plane,
a lattice constant a of the virtual square lattice satisfies $\lambda = \sqrt{2} \times a \times n$, where λ, is an emission wavelength, n is an effective refractive index of the phase modulation layer with respect to output light, and
a pair of adjacent, different refractive index regions in the phase modulation layer with a pitch of α between the different refractive index regions satisfies an arrangement where
one of the different refractive index regions coincides with the other different refractive index region when the one different refractive index region is shifted in only one direction by the pitch of α, and
the one different refractive index region does not coincide with the other different refractive index region when the one different refractive index regions is shifted in another direction by the pitch of α.

2. The semiconductor light emitting element according to claim 1, wherein
in a case where a wave number k and a frequency f of laser light to be output in the thickness direction of the phase modulation layer satisfy the following condition:

$f > m \times |k|$, where m>0,
zero-order light of the laser light to be emitted perpendicularly to a light emitting face of the phase modulation layer satisfies the following condition:

$f \leq m \times |k|$, and the different refractive index regions are arranged such that the laser light includes a dark line without the zero-order light.

3. A semiconductor light emitting element comprising:
an active layer;
a pair of cladding layers between which the active layer is interposed; and
a phase modulation layer optically coupled to the active layer, wherein
the phase modulation layer includes:
a base layer; and
different refractive index regions that are different in refractive index from the base layer, an XYZ orthogonal coordinate system is set in which a thickness direction of the phase modulation layer is defined as a Z-axis direction, a first virtual square lattice is set in an XY plane, a pitch in an X-axis direction of the first virtual square lattice is $a/\sqrt{2}$, a pitch in a Y-axis direction of the first virtual square lattice is $a/\sqrt{2}$, XY coordinates $(x_i, y_j)$ of a barycentric position of an opening of the first virtual square lattice satisfy $$(x_i, y_j) = ((i-0.5)a/\sqrt{2}, (j-0.5)a/\sqrt{2}),$$

where i and j each is an integer, a vector connecting XY coordinates $(x_{Bi}, y_{Bj})$ of a barycentric position of any of the different refractive index regions and the XY coordinates $(x_i, y_j)$ closest to the different refractive index region, directed from the XY coordinates $(x_i, y_j)$ to the XY coordinates $(x_{Bi}, y_{Bj})$ of the barycentric position of the different refractive index region, is defined as $(\Delta x_i, \Delta y_j)$, and in a case where the coordinates $(x_{Bi}, y_{Bj})$ of the barycentric position of the different refractive index region are present with i that is an odd number, the coordinates $(x_{Bi}, y_{Bj})$ of the barycentric position of any of the different refractive index regions are present only in a case where i is an odd number and j is an odd number and in a case where i is an even number and j is an even number, the vector $(\Delta x_i, \Delta y_j)$ for the coordinates $(x_{Bi}, y_{Bj}) = (x_i + \Delta x_i, y_j + \Delta y_j)$ with i and j that are odd numbers and that satisfy $3 \le i$ and $3 \le j$ is equal to a vector $(\Delta x_{i+1}, \Delta y_{j+1})$,
different from a vector $(\Delta x_{i-1}, \Delta y_{j+1})$,
different from a vector $(\Delta x_{i-1}, \Delta y_{j-1})$, and
different from a vector $(\Delta x_{i+1}, \Delta y_{j-1})$, and the vector $(\Delta x_i, \Delta y_j)$ for the coordinates $(x_{Bi}, y_{Bj}) = (x_i + \Delta x_i, y_j + \Delta y_j)$ with i and j that are even numbers and that satisfy $2 \le i$ and $2 \le j$ is equal to the vector $(\Delta x_{i-1}, \Delta y_{j-1})$,
different from the vector $(\Delta x_{i-1}, \Delta y_{j+1})$,
different from the vector $(\Delta x_{i+1}, \Delta y_{j+1})$, and
different from the vector $(\Delta x_{i+1}, \Delta y_{j-1})$.

4. The semiconductor light emitting element according to claim 3, wherein in a case where a wave number k and a frequency f of laser light to be output in the thickness direction of the phase modulation layer satisfy the following condition:

$$f > m \times |k|,$$

where $m > 0$, zero-order light of the laser light to be emitted perpendicularly to a light emitting face of the phase modulation layer satisfies the following condition:

$$f \le m \times |k|, \text{ and}$$

the different refractive index regions are arranged such that the laser light includes a dark line without the zero-order light.

5. A semiconductor light emitting element comprising:
an active layer;
a pair of cladding layers between which the active layer is interposed; and a phase modulation layer optically coupled to the active layer, wherein the phase modulation layer includes:
a base layer; and
different refractive index regions that are different in refractive index from the base layer, an XYZ orthogonal coordinate system is set in which a thickness direction of the phase modulation layer is defined as a Z-axis direction, a first virtual square lattice is set in an XY plane, a pitch in an X-axis direction of the first virtual square lattice is $a/\sqrt{2}$, a pitch in a Y-axis direction of the first virtual square lattice is $a/\sqrt{2}$, XY coordinates $(x_i, y_j)$ of a barycentric position of an opening of the first virtual square lattice satisfy $$(x_i, y_j) = ((i-0.5)a/\sqrt{2}, (j-0.5)a/\sqrt{2}),$$

where i and j each is an integer, a vector connecting XY coordinates $(x_{Bi}, y_{Bj})$ of a barycentric position of any of the different refractive index regions and the XY coordinates $(x_i, y_j)$ closest to the different refractive index region, directed from the XY coordinates $(x_i, y_j)$ to the XY coordinates $(x_{Bi}, y_{Bj})$ of the barycentric position of the different refractive index region, is defined as $(\Delta x_i, \Delta y_j)$, and in a case where the coordinates $(x_{Bi}, y_{Bj})$ of the barycentric position of the different refractive index region is present with i+j that is an odd number, the coordinates $(x_{Bi}, y_{Bj})$ of the barycentric position of any of the different refractive index regions are present only in a case where i is an odd number and j is an even number and in a case where i is an even number and j is an odd number, the vector $(\Delta x_i, \Delta y_j)$ for the coordinates $(x_{Bi}, y_{Bj}) = (x_i + \Delta x_i, y_j + \Delta y_j)$ with i that is an even number $(2 \le i)$ and j that is an odd number $(1 \le j)$ is equal to a vector $(\Delta x_{i-1}, \Delta y_{j+1})$,
different from a vector $(\Delta x_{i+1}, \Delta y_{j+1})$,
different from a vector $(\Delta x_{i-1}, \Delta y_{j-1})$, and
different from a vector $(\Delta x_{i+1}, \Delta y_{j-1})$, and the vector $(\Delta x_i, \Delta y_j)$ for the coordinates $(x_{Bi}, y_{Bj}) = (x_i + \Delta x_i, y_j + \Delta y_j)$ with i that is an odd number $(1 \le i)$ and j that is an even number $(2 \le j)$ is equal to the vector $(\Delta x_{i+1}, \Delta y_{j-1})$,
different from the vector $(\Delta x_{i-1}, \Delta y_{j+1})$,
different from the vector $(\Delta x_{i+1}, \Delta y_{j+1})$, and
different from the vector $(\Delta x_{i-1}, \Delta y_{j-1})$.

6. The semiconductor light emitting element according to claim 5, wherein in a case where a wave number k and a frequency f of laser light to be output in the thickness direction of the phase modulation layer satisfy the following condition:

$$f > m \times |k|,$$

where $m > 0$, zero-order light of the laser light to be emitted perpendicularly to a light emitting face of the phase modulation layer satisfies the following condition:

$$f \le m \times |k|, \text{ and}$$

the different refractive index regions are arranged such that the laser light includes a dark line without the zero-order light.

* * * * *